United States Patent
Suzuki et al.

(10) Patent No.: US 8,080,587 B2
(45) Date of Patent: Dec. 20, 2011

(54) OIL-IN-WATER (O/W) EMULSION COATING COMPOSITING, LAMINATE, POLARIZING PLATE, IMAGE DISPLAY DEVICE AND PRODUCTION METHOD OF THE LAMINATE

(75) Inventors: Takato Suzuki, Minami-Ashigara (JP); Hiroyuki Yoneyama, Minami-Ashigara (JP); Tetsuya Asakura, Minami-Ashigara (JP); Jun Watanabe, Minami-Ashigara (JP); Masafumi Yoshida, Minami-Ashigara (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 289 days.

(21) Appl. No.: 11/797,076

(22) Filed: Apr. 30, 2007

(65) Prior Publication Data

US 2007/0254087 A1    Nov. 1, 2007

(30) Foreign Application Priority Data

May 1, 2006   (JP) ................................. 2006-127515

(51) Int. Cl.
    *B01F 3/08*    (2006.01)
(52) U.S. Cl. .......................................... 516/53; 426/602
(58) Field of Classification Search .................... 516/53; 426/602

See application file for complete search history.

(56) References Cited

U.S. PATENT DOCUMENTS

| 5,232,815 | A  | * | 8/1993  | Browne et al. ............... 430/191 |
| 5,387,463 | A  | * | 2/1995  | Nakamura et al. ............ 428/327 |
| 5,981,147 | A  | * | 11/1999 | Hallock et al. ............. 430/281.1 |
| 6,207,744 | B1 | * | 3/2001  | Paulus et al. ................. 524/507 |
| 2001/0037935 | A1 | * | 11/2001 | Oya et al. ..................... 200/512 |
| 2004/0157959 | A1 | * | 8/2004  | Turgis et al. ................. 523/160 |

FOREIGN PATENT DOCUMENTS

| JP | 6-271632 A | 9/1994 |
| JP | 6-287260 A | 10/1994 |

* cited by examiner

*Primary Examiner* — Ling Choi
*Assistant Examiner* — Chun-Cheng Wang
(74) *Attorney, Agent, or Firm* — Buchanan Ingersoll & Rooney PC

(57) ABSTRACT

An oil-in-water type emulsion coating composition having an aqueous phase and an oil phase, the oil-in-water type emulsion coating composition containing: an active energy ray-curable polyfunctional (meth)acrylate having three or more (meth)acryloyl groups within a molecule; and an organic solvent, in the oil phase, the organic solvent having a solubility of 30 g or less in 100 g of water and having a property capable of swelling or dissolving a substrate.

30 Claims, 2 Drawing Sheets

OIL-IN-WATER (O/W) EMULSION COATING COMPOSITING, LAMINATE, POLARIZING PLATE, IMAGE DISPLAY DEVICE AND PRODUCTION METHOD OF THE LAMINATE

FIELD OF THE INVENTION

The present invention relates to an oil-in-water (O/W) type emulsion coating composition, a laminate, a polarizing plate, an image display device and a production method of the laminate.

BACKGROUND OF THE INVENTION

An organic solvent is used in coating compositions of various coatings such as overcoat agent for plastic films, printing ink and coating material. Due to the fear that a volatile organic component volatilizing from the organic solvent affects a worker, the process, production apparatus and the like involving the handling of such a coating composition are complicated to induce a large load in view of operation and equipment. Also, the volatile organic component imposes a heavy load such as air pollution on the environment. Accordingly, from the standpoint of reducing the economical load and environmental load, it is recently demanded to decrease the amount of the organic solvent used in the coating compound.

For example, there has been proposed an active energy ray-curable aqueous resin composition comprising a vehicle and water as essential components, in which the vehicle is a reaction product comprising a hydroxyl group-containing acrylic acid ester, an organic polyisocyanate and (C) a polyethylene glycol containing at least one hydroxyl group (see, JP-A-6-271632 (the term "JP-A" as used herein means an "unexamined published Japanese patent application") and JP-A-6-287260).

However, when a layer is formed on a substrate by curing a coating composition containing water, if the adhesion between the substrate and the cured layer is low, the scratch resistance decreases. A coating composition ensuring higher scratch resistance optimal for surface coating of an article is being demanded.

SUMMARY OF THE INVENTION

In one aspect, the object of the present invention is to provide an oil-in-water (O/W) type emulsion coating composition assured of excellent scratch resistance and reduced in the amount of an organic solvent used. In another aspect, the object of the present invention is to provide a laminate having a layer formed by curing the coating composition, a polarizing plate having the laminate, and an image display device having the laminate or the polarizing plate. In still another aspect, the object of the present invention is to provide a method for producing a laminate having a layer formed by curing the coating composition.

As a result of intensive investigations to solve the above-described problems, the present inventors have found that when the following constructions are employed, those problems can be overcome and the objects can be attained. The present invention has been accomplished based on this finding. That is, the present invention is as follows.

(1) An oil-in-water (O/W) type emulsion coating composition having an aqueous phase and an oil phase, the oil-in-water (O/W) type emulsion coating composition comprising:

(A) an active energy ray-curable polyfunctional (meth) acrylate having at least three or more (meth)acryloyl groups within the molecule, and (B) an organic solvent, in the oil phase, the organic solvent being an organic solvent having a solubility of 30 g or less in 100 g of water and having a property capable of swelling or dissolving a substrate.

(2) An oil-in-water (O/W) type emulsion coating composition having an aqueous phase and an oil phase, the oil-in-water (O/W) type emulsion coating composition comprising:

(A) an active energy ray-curable polyfunctional (meth) acrylate having at least three or more (meth)acryloyl groups within the molecule, in the oil phase, and (B) an active energy ray-curable polyfunctional (meth) acrylate having at least one or more (meth)acryloyl group within the molecule and having a solubility of 3 g or more in 100 g of water, in the aqueous phase.

(3) An oil-in-water (O/W) type emulsion coating composition having an aqueous phase and an oil phase, the oil-in-water (O/W) type emulsion composition comprising:

(A) an emulsion containing an active energy ray-curable polyfunctional (meth)acrylate having at least three or more (meth)acryloyl groups within the molecule, and (B) an emulsion containing at least one compound not contained in the emulsion of (A).

(4) The coating composition as described in any one of 1 to 3 above, wherein a particle having an average particle diameter of 1 to 10 μm is further contained in the aqueous phase and/or the oil phase.

(5) The coating composition as described in any one of 1 to 4 above, wherein the boiling point of the organic solvent is from 75 to 220° C.

(6) The coating composition as described in any one of 1 to 5 above, wherein the proportion of the organic solvent is from 1 to 30 wt %.

(7) The coating composition as described in any one of 1 to 6 above, wherein a photopolymerization initiator is further contained in the aqueous phase and/or the oil phase.

(8) The coating composition as described in any one of 1 to 7 above, wherein a fluorine-based leveling agent and/or a silicone-based leveling agent is further contained in the aqueous phase and/or the oil phase.

(9) A laminate comprising a transparent support having thereon a cured layer formed by curing the coating composition described in any one of 1 to 8 above.

(10) The laminate as described in 9 above, which is used for an optical film or an antireflection film.

(11) A polarizing plate comprising a polarizing film and protective films located on both sides of the polarizing film, wherein at least one of the protective films is the laminate described in 9 or 10 above.

(12) An image display device having the laminate described in 9 or 10 above or the polarizing plate described in 11 above.

(13) A method for producing a laminate comprising a transparent support having thereon a layer formed by curing a coating composition, the production method comprising a step of coating the coating composition described in any one of 1 to 8 above and a step of drying the coating.

According to the present invention, an oil-in-water (O/W) type emulsion coating composition (preferably an oil-in-water (O/W) type emulsion-containing curable coating composition or an active energy ray-curable aqueous resin composition) assured of excellent scratch resistance and reduced in the amount of an organic solvent used can be provided. Also, a laminate (preferably a laminate for optical film (optical film) or a laminate for antireflection film (antireflection film)) having a layer formed by curing the coating composition can be provided.

According to the present invention, a polarizing plate and an image display device, each having the laminate with good scratch resistance, can be produced. Furthermore, according to the present invention, a method for producing a laminate by using the coating composition and a laminate produced using the coating composition can be provided.

The coating composition of the present invention contains a small amount of an organic solvent having a property of swelling or dissolving a transparent support suitable for optical films and the like and therefore, interfacial mixing between the coating composition and the transparent support occurs to provide a state that the transparent support and the coating composition are inter-penetrated with each other. When the coating composition in the progress of interfacial mixing is cured to form a laminate, a state that respective molecular chains of the laminate and the transparent support are interlaced at the interface therebetween is created and this seems to enable obtaining a laminate with good adhesion. In the case of a conventional coating composition not containing an organic solvent, it is considered that interfacial mixing between the transparent support and the coating composition does not take place and the adhesion cannot be ensured.

The layer formed by curing the coating composition of the present invention has high adhesion, so that this layer can be suitably used for an optical film (hardcoat film, antiglare film or antireflection film) and the like and furthermore, can possess the advantages of high scratch resistance and small environmental load.

Figure 1:
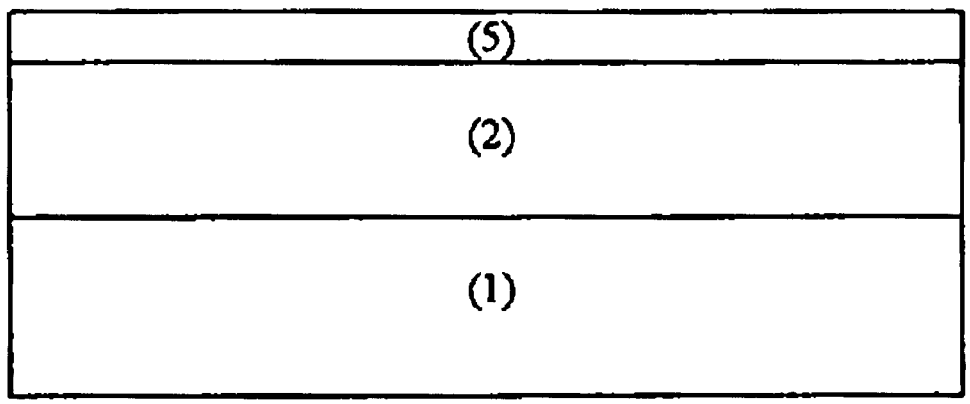
FIG. 1 is a schematic section schematically showing a preferred embodiment of the film of the present invention.

DESCRIPTION OF REFERENCE NUMERALS (1) Transparent support
(2) Hardcoat layer
(3) Medium refractive index layer
(4) High refractive index layer
(5) Low refractive index layer

DETAILED DESCRIPTION OF THE INVENTION

In the present invention, when a numerical value expresses a physical or characteristic value or the like, the phrase "from (numerical value 1) to (numerical value 2)" means "(numerical value 1) or more and (numerical value 2) or less". Also, the term "(meth)acrylate" as used in the present invention means "at least either acrylate or methacrylate". The same applies to "(meth)acrylic acid" and the like.

The oil-in-water (O/W) type emulsion coating composition (having the same meaning as the "coating composition of the present invention") and the laminate (having the same meaning as the "laminate of the present invention") are described below.

<Oil-in-Water (O/W) Type Emulsion Coating Composition>

The present invention relates to an oil-in-water (O/W) type emulsion coating composition having an aqueous phase and an oil phase, the oil-in-water (O/W) type emulsion coating composition comprising (A) an active energy ray-curable polyfunctional (meth)acrylate having at least three or more (meth)acryloyl groups within the molecule and (B) an organic solvent, in the oil phase, the organic solvent being an organic solvent having a solubility of 30 g or less in 100 g of water and having a property capable of swelling or dissolving a substrate (hereinafter referred to as a "first invention").

In another aspect, the present invention relates to an oil-in-water (O/W) type emulsion coating composition having an aqueous phase and an oil phase, the oil-in-water (O/W) type emulsion coating composition comprising (A) an active energy ray-curable polyfunctional (meth)acrylate having at least three or more (meth)acryloyl groups within the molecule, in the oil phase, and (B) an active energy ray-curable polyfunctional (meth)acrylate having at least one or more (meth)acryloyl group within the molecule and having a solubility of 3 g or more in 100 g of water, in the aqueous phase (hereinafter referred to a "second invention").

In still another aspect, the present invention relates to an oil-in-water (O/W) type emulsion coating composition having an aqueous phase and an oil phase, the oil-in-water (O/W) type emulsion composition comprising (A) an emulsion containing an active energy ray-curable polyfunctional (meth)acrylate having at least three or more (meth)acryloyl groups within the molecule and (B) an emulsion containing at least one compound not contained in the emulsion of (A) (hereinafter referred to as a "third invention").

In the first to third inventions of the present invention, a particle having an average particle diameter of 1 to 10 μm is preferably further contained in the aqueous phase and/or the oil phase.

In the first to third inventions of the present invention, it is preferred that the boiling point of the organic solvent is from 75 to 220° C. and/or the proportion of said organic solvent is from 1 to 30 wt %.

In the first to third inventions of the present invention, a photopolymerization initiator is preferably further contained in the aqueous phase and/or the oil phase.

In the first to third inventions of the present invention, a fluorine-based leveling agent and/or a silicone-based leveling agent is preferably further contained in the aqueous phase and/or the oil phase.

The constituent materials contained in the coating composition of the present invention are described below. Unless otherwise specified, the description of constituent materials is common in the first to third inventions of the present invention.

The coating composition of the present invention is an emulsion coating composition having an aqueous phase and an oil phase, in which oil droplets (oil phase) are dispersed in the aqueous phase. The ratio between the aqueous phase and the oil phase in the coating composition is not limited as long as the aqueous phase is a main component, but their contents are preferably from 10 to 49 wt % of oil phase and from 51 to 90 wt % of aqueous phase, more preferably from 20 to 49 wt % of oil phase and from 51 to 80 wt % of aqueous phase, still more preferably from 30 to 49 wt % of oil phase and from 51 to 70 wt % of aqueous phase.

In the third invention,
(A) an emulsion containing an active energy ray-curable polyfunctional (meth)acrylate having at least three or more (meth)acryloyl groups within the molecule, and (B) an emulsion containing at least one compound not contained in the emulsion of (A) are contained in the oil phase.

The ratio between emulsions of (A) and (B) in the third invention is not particularly limited, but (A):(B) is preferably from 10 to 49 wt %: from 51 to 90 wt %, more preferably from 20 to 49 wt % from 51 to 80 wt %, still more preferably from 30 to 49 wt %: from 51 to 70 wt %.

In the case of a normal oil-in-water (O/W) type emulsion coating composition having an aqueous phase and an oil phase, an active energy ray-curable polyfunctional (meth) acrylate having at least three or more (meth)acryloyl groups within the molecule and other materials to be dispersed in the oil phase are previously mixed and the mixture is then formed into an emulsion, thereby obtaining an oil-in-water (O/W) type emulsion coating composition having an aqueous phase and an oil phase.

However, depending on the combination of materials mixed in advance, the polymerization may be initiated or the aging stability of the emulsion may be deteriorated. In such a case, the materials are not mixed but are individually formed into an emulsion and respective emulsions are mixed, whereby an oil-in-water (O/W) type emulsion coating composition having an aqueous phase and an oil phase and not allowing for initiation of polymerization, decrease of stability or the like can be obtained.

(Active Energy Ray-Curable Polyfunctional (Meth)acrylate)

The coating composition of the present invention is prepared by the emulsion formation of an active ray-curable polyfunctional (meth)acrylate. Specific examples of the active energy ray-curable polyfunctional (meth)acrylate are described below.

Examples of the active energy ray-curable polyfunctional (meth)acrylate include (meth)acrylic acid diesters of alkylene glycol; (meth)acrylic acid diesters of polyoxyalkylene glycol; (meth)acrylic acid diesters of polyhydric alcohol; and (meth)acrylic acid diesters of ethylene oxide or propylene oxide adduct.

Furthermore, epoxy (meth)acrylates, urethane (meth)acrylates and polyester (meth)acrylates may also be preferably used as the photopolymerizable polyfunctional monomer.

Among these, a polyfunctional monomer having three or more (meth)acryloyl groups within one molecule is preferred. Specific examples thereof include trimethylolpropane tri(meth)acrylate, trimethylolethane tri(meth)acrylate, 1,2,4-cyclohexane tetra(meth)acrylate, pentaglycerol triacrylate, pentaerythritol tetra(meth)acrylate, pentaerythritol tri(meth)acrylate, (di)pentaerythritol triacrylate, (di)pentaerythritol pentaacrylate, (di)pentaerythritol tetra(meth)acrylate, (di)pentaerythritol hexa(meth)acrylate, tripentaerythritol triacrylate and tripentaerythritol hexatriacrylate. In the present invention, the terms "(meth)acrylate", "(meth)acrylic acid" and "(meth)acryloyl" indicate "acrylate or methacrylate", "acrylic acid or methacrylic acid" and "acryloyl or methacryloyl", respectively.

A urethane (meth)acrylate may also be suitably used as the active energy ray-curable polyfunctional (meth)acrylate for use in the coating composition of the present invention. The urethane (meth)acrylate in the composition of the present invention must contain at least three or more (meth)acryloyl groups bonded to the main chain of its oligomer and preferably contains four or more, more preferably six or more, (meth)acryloyl groups.

Specific preferred examples of the urethane (meth)acrylate (B) include a compound represented by the following formula (2):

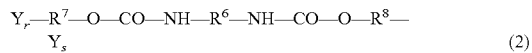

$$Y_r\text{—}R^7\text{—}O\text{—}CO\text{—}NH\text{—}R^6\text{—}NH\text{—}CO\text{—}O\text{—}R^8\text{—}$$
$$Y_s \quad (2)$$

$R^6$ is a divalent organic group and is selected from divalent organic groups having a molecular weight of usually from 14 to 10,000, preferably from 76 to 500.

$R^7$ and $R^8$ are (r+1)-valent and (s+1)-valent organic groups, respectively, and each is preferably selected from a linear, branched or cyclic saturated hydrocarbon group and an unsaturated hydrocarbon group.

Y represents a monovalent organic group having in the molecule thereof a polymerizable unsaturated group capable of causing an intermolecular crosslinking reaction in the presence of an active radical species. Also, r and s each is preferably an integer of 1 to 20, more preferably from 1 to 10, still more preferably from 1 to 5. In the formula, $R^7$ and $R^8$ may be the same or different, and $Y_r$ and $Y_s$ may be the same or different.

Examples of the urethane (meth)acrylate for use in the present invention include BEAM SET 102, 502H, 505A-6, 510, 550B, 551B, 575 and 575CB, trade names, produced by Arakawa Chemical Industries, Ltd.; PHOTOMER 6008 and 6210, trade names, produced by San Nopco Ltd.; NK OLIGO U-2PPA, U-4HA, U-6HA, H-15HA, UA-32PA, U-324A, U-4H and U-6H, trade names, produced by Shin-Nakamura Chemical Co., Ltd.; ARONIX M-1100, M-1200, M-1210, M-1310, M-1600 and M-1960, trade names, produced by Toagosei Co., Ltd.; AH-600, AT606 and UA-306H, trade names, produced by Kyoeisha Chemical Co., Ltd.; KAYARAD UX-2201, UX-2301, UX-3204, UX-3301, UX-4101, UX-6101 and UX-7101, trade names, produced by Nippon Kayaku Co., Ltd.; SHIKOH UV-1700B, UV-3000B, UV-6100B, UV-6300B, UV-7000 and UV-2010B, trade names, produced by Nippon Synthetic Chemical Industry Co., Ltd.; ART RESIN UN-1255, UN-5200, HDP-4T, HMP-2, UN-901T, UN-3320HA, UN-3320HB, UN-3320HC, UN-3320HS, H-61 and HDP-M20, trade names, produced by Negami Chemical Industrial Co., Ltd.; and Ebecryl 6700, 204, 205, 220, 254, 1259, 1290K, 1748, 2002, 2220, 4833, 4842, 4866, 5129, 6602 and 8301, trade names, produced by DAICEL-UCB Co., Ltd.

As for the active energy ray-curable polyfunctional (meth) acrylate for use in the present invention, monomers differing in the refractive index may be used for controlling the refractive index of each layer. In particular, examples of the high refractive index monomer include bis(4-methacryloylthiophenyl)sulfide, vinylnaphthalene, vinyl phenyl sulfide and 4-methacryloxyphenyl-4'-methoxyphenylthioether. Also, dendrimers described, for example, in JP-A-2005-76005 and JP-A-2005-36105, and norbornene ring-containing monomers described, for example, in JP-A-2005-60425 may be used.

(Self-Emulsification Type Acrylate)

A self-emulsification type acrylate may also be suitably used as the active energy ray-curable polyfunctional (meth) acrylate having at least three or more (meth)acryloyl groups for use in the coating composition of the present invention. The self-emulsification type acrylate has a structure that a hydrophilic group and a hydrophobic group are separated, and can be formed into an emulsion without requiring a monomer or an emulsifier. The hydrophilic group includes an ionic type and a nonionic type and in view of dispersion stability, a nonionic type is preferred. As for the nonionic type, those having a polyalkylene glycol structure are preferred, and those having a polyethylene glycol structure are more preferred.

((Meth)acrylate in Second Invention)

In the second invention, the (B) active energy ray-curable polyfunctional (meth)acrylate having at least one or more (meth)acryloyl group within the molecule and having a solubility of 3 g or more in 100 g of water is contained in the aqueous phase. Examples of the (meth)acrylate include tetraethylene oxide di(meth)acrylate, hexaethylene oxide di(meth)acrylate, polyethylene oxide di(meth)acrylate, EO-modified trimethylolpropane tri(meth)acrylate, 2-hydroxyethyl (meth)acrylate, 2-hydroxypropyl (meth)acrylate, pentaerythritol tri(meth)acrylate, phenyl glycidyl ether epoxy (meth)acrylate, 1,6-hexanediol diglycidyl ether epoxy (meth)acrylate, glycerin triglycidyl ether epoxy (meth)acrylate and bisphenol A diglycidyl ether epoxy (meth)acrylate.

The amount of the (meth)acrylate, which is the component (B) in the second invention, used is preferably from 1 to 30 mass %, more preferably from 2 to 20 mass %, based on the total mass of the component (A). When the amount of the component (B) is within these ranges, the adhesion of the hardcoat layer made from the coating composition to the support is particularly good, and the hardcoat layer having particularly high hardness can be made.

An overcoat layer is preferably provided on the hardcoat layer so as to impart film hardness to the film.

A polyfunctional monomer having three or more (meth)acryloyl groups within one molecule is preferred as the material for the coating composition of an overcoat layer. Specific examples thereof include trimethylolpropane tri(meth)acrylate, trimethylolethane tri(meth)acrylate, 1,2,4-cyclohexane tetra(meth)acrylate, pentaglycerol triacrylate, pentaerythritol tetra(meth)acrylate, pentaerythritol tri(meth)acrylate, (di)pentaerythritol triacrylate, (di)pentaerythritol pentaacrylate, (di)pentaerythritol tetra(meth)acrylate, (di)pentaerythritol hexa(meth)acrylate, tripentaerythritol triacrylate and tripentaerythritol hexatriacrylate.

The term "(meth)acrylate" as used in the present invention means "at least either acrylate or methacrylate". The same applies to "(meth)acrylic acid" and the like. A urethane (meth)acrylate may also be suitably used as the radical polymerizable polyfunctional monomer used in the coating composition of an overcoat layer the present invention. The urethane (meth)acrylate used in the composition of the present invention must contain at least one (meth)acryloyl group bonded to the main chain of the oligomer and preferably contains 3 or more, more preferably contains 4 or more, further more preferably 6 or more, (meth)acryloyl groups.

Specific preferred examples of the urethane (meth)acrylate include a compound represented by the following formula (2):

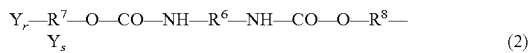

$$Y_r—R^7—O—CO—NH—R^6—NH—CO—O—R^8— \atop Y_s \qquad (2)$$

$R^6$ is a divalent organic group and is selected from divalent organic groups having a molecular weight of usually from 14 to 10,000, preferably from 76 to 500. $R^7$ and $R^8$ are (r+1)-valent and (s+1)-valent organic groups, respectively, and each is preferably selected from linear, branched or cyclic saturated hydrocarbon groups and unsaturated hydrocarbon groups. Y represents a monovalent organic group having in the molecule thereof a polymerizable unsaturated group capable of causing an intermolecular crosslinking reaction in the presence of an active radical species. Also, r and s each is preferably an integer of 1 to 20, more preferably from 1 to 10, still more preferably from 1 to 5. In the formula, $R^7$ and $R^8$ may be the same or different, and $Y_r$ and $Y_s$ may be the same or different.

Examples of the urethane (meth)acrylate for use in the present invention include BEAM SET 102, 502H, 505A-6, 510, 550B, 551B, 575, and 575CB, trade names, produced by Arakawa Chemical Industries, Ltd.; PHOTOMER 6008 and 6210, trade names, produced by San Nopco Ltd.; NK OLIGO U-2PPA, U-4HA, U-6HA, H-15HA, UA-32PA, U-324A, U-4H and U-6H, trade names, produced by Shin-Nakamura Chemical Co., Ltd.; ARONIX M-1100, M-1200, M-1210, M-1310, M-1600 and M-1960, trade names, produced by Toagosei Co., Ltd.; AH-600, AT606 and UA-306H, trade names, produced by Kyoeisha Chemical Co., Ltd.; KAYARAD UX-2201, UX-2301, UX-3204, UX-3301, UX-4101, UX-6101 and UX-7101, trade names, produced by Nippon Kayaku Co., Ltd.; SHIKOH UV-1700B, UV-3000B, UV-6100B, UV-6300B, UV-7000 and UV-2010B, trade names, produced by Nippon Synthetic Chemical Industry Co., Ltd.; ART RESIN UN-1255, UN-5200, HDP-4T, HMP-2, UN-901T, UN-3320HA, UN-3320HB, UN-3320HC, UN-3320HS, H-61 and HDP-M20, trade names, produced by Negami Chemical Industrial Co., Ltd.; and Ebecryl 6700, 204, 205, 220, 254, 1259, 1290K, 1748, 2002, 2220, 4833, 4842, 4866, 5129, 6602 and 8301, trade names, produced by DAICEL-UCB Co., Ltd.

(Particle)

The coating composition of the present invention contains a particle (preferably a light-transparent particle) having an average particle diameter of 1 to 10 μm. In order to impart antiglare property (surface scattering property)•internal scattering property and laminate hardness to the laminate obtained by coating the coating composition, various particles (hereinafter referred to as a "particle") may be used in the coating composition.

The particle for use in the present invention is generally a water-insoluble organic or inorganic compound particle. An arbitrary particle may be used, and those well known in the industry of photographic photosensitive material, for example, organic matting agents described in U.S. Pat. Nos. 1,939,213, 2,701,245, 2,322,037, 3,262,782, 3,539,344 and 3,767,448 and inorganic matting agents described in U.S. Pat. Nos. 1,260,772, 2,192,241, 3,257,206, 3,370,951, 3,523,022 and 3,769,020, can be used.

Examples of the organic compound particle which can be preferably used include a water-dispersible vinyl polymer such as polymethyl acrylate, polymethyl methacrylate, polyacrylonitrile, acrylonitrile-α-methylstyrene copolymer, polystyrene, styrene-divinylbenzene copolymer, polyvinyl acetate, polyethylene carbonate, polytetrafluoroethylene; a cellulose derivative such as methyl cellulose, cellulose acetate and cellulose acetate propionate; a starch derivative such as carboxy starch, carboxynitrophenyl starch and urea-formaldehyde-starch reaction product; a gelatin hardened with a known hardening agent; and a gelatin hardened by coacervation into a microcapsulated hollow particle form.

Examples of the inorganic compound particle which can be preferably used include silicon dioxide, titanium dioxide, magnesium dioxide, aluminum dioxide, barium sulfate, calcium carbonate, silver chloride desensitized by a known method, silver bromide desensitized by a known method, glass and diatomaceous earth. As for this particle, different kinds of substances may be mixed and used, if desired. The size and shape of the particle are not particularly limited, and a particle having an arbitrary particle diameter can be used.

In the present invention, a particle having an average particle diameter of 1 μm to 10 μm is used. The average particle diameter is more preferably 1.25 to 8.5 µm. The particle diameter distribution of the particle may be narrow or broad. The coefficient of variation of the size distribution is preferably 50% or less, more preferably 40% or less, still more preferably 30% or less. Here, the coefficient of variation is a value represented by (standard deviation of particle diameter)/(average particle diameter)×100%. It is also preferred to use in combination two kinds of light-transparent particles having a small coefficient of variation, with the ratio between their average particle diameters being more than 3.

As regards the method for measuring the average particle diameter of the light-transparent particle, an arbitrary measuring method may be applied as long as it is a measuring method of measuring the average particle diameter of a particle, but a method of observing 100 particles by a scanning electron microscope (magnification: 1,000 times) and using the average value thereof as the average particle diameter is preferred.

On the other hand, the (light-transparent) particle greatly affects the haze and surface gloss of the coating film and therefore, the required particle size, shape and particle diameter distribution are preferably realized by controlling the conditions at the preparation of the light-transparent particle or by mixing a plurality of light-transparent particles.

In the present invention, the light-transparent particle is preferably a particle comprising a polymer like the above-described organic compound. In particular, a polymer having a glass transition temperature of 60 to 150° C. is preferred, and a polymer having a glass transition temperature of 80 to 130° C. is more preferred.

Examples of the (light-transparent) particle which can be preferably used in the present invention are set forth below, but the present invention is not limited to these compounds.

M-1: Polyethylene particle, specific gravity: 0.90 (FLO-BEADS LE-1080, produced by Sumitomo Seika Chemicals Co., Ltd.)

M-2: Polyethylene particle, specific gravity: 0.93 (FLO-BEADS EA-209, produced by Sumitomo Seika Chemicals Co., Ltd.)

M-3: Polyethylene particle, specific gravity: 0.96 (FLO-BEADS HE-3040, produced by Sumitomo Seika Chemicals Co., Ltd.)

M-4: Silicone particle, specific gravity: 0.97

M-5: Silicone particle, specific gravity: 1.00 (E701, produced by Dow Toray Silicone Co., Ltd.)

M-6: Silicone particle, specific gravity: 1.03

M-7: Polystyrene particle, specific gravity: 1.05 (SB-6, produced by Sekisui Plastics Co., Ltd.)

M-8: Poly(St/MAA=97/3) copolymer particle, specific gravity: 1.05

M-9: Poly(St/MAA=90/10) copolymer particle, specific gravity: 1.06

M-10: Poly(St/MMA/MAA=50/40/10) copolymer particle, specific gravity: 1.09

M-11: Crosslinked polyethylene particle, specific gravity: 0.92

M-12: Crosslinked polyethylene particle, specific gravity: 0.95

M-13: Crosslinked polyethylene particle, specific gravity: 0.98

M-14: Crosslinked silicone particle, specific gravity: 0.99

M-15: Crosslinked silicone particle, specific gravity: 1.02

M-16: Crosslinked silicone particle, specific gravity: 1.04

M-17: Poly(St/DVB=90/10) particle, specific gravity: 1.06 (SX-713, produced by The Soken Chemical & Engineering Co., Ltd.)

M-18: Poly(St/DVB=80/20) particle, specific gravity: 1.06 (SX-713, produced by The Soken Chemical & Engineering Co., Ltd.)

M-19: Poly(St/DVB=70/30) particle, specific gravity: 1.07 (SX-713, produced by The Soken Chemical & Engineering Co., Ltd.)

M-20: Poly(St/MAA/DVB=87/3/10) copolymer particle, specific gravity: 1.06 (SX-713α, produced by The Soken Chemical & Engineering Co., Ltd.)

M-21: Poly(St/MAA/DVB=80/10/10) copolymer particle, specific gravity: 1.07 (SX-713α, produced by The Soken Chemical & Engineering Co., Ltd.)

M-22: Poly(St/MMA/MAA/DVB=40/40/10/10) copolymer particle, specific gravity: 1.10

M-23: Silica particle (SYLYSIA 435, produced by Fuji Silysia Chemical Ltd.)

M-24: Alumina particle

In the present invention, the shape of the (light-transparent) particle is not particularly limited and other than a completely spherical particle, a (light-transparent) particle having a different shape, such as irregularly shaped particle (e.g., non-spherical particle, dimpled particle), may be used in combination. In particular, when the short axis of a non-spherical particle is aligned parallel to the normal direction of the light-diffusing layer, this allows for use of a particle having a small particle diameter as compared with a completely spherical particle.

The particle for use in the present invention is preferably blended to occupy from 5 to 40 mass %, more preferably from 5 to 25 mass %, still more preferably from 7 to 20 mass %, in the entire solid content of the coating composition. The content is preferably 5 mass % or more in view of the effect by the addition and preferably 40 mass % or less in view of scarcely causing a problem such as image blurring or surface clouding or glaring.

The particle is preferably used in the range from 1 to 2,500 mg/m$^2$, more preferably from 5 to 2,300 mg/m$^2$, in terms of the coated amount per m$^2$.

In the case of using a resin particle as the particle for use in the present invention, the compressive strength of the resin particle is preferably from 4 to 10 kgf/mm$^2$, more preferably from 4 to 8 kgf/mm$^2$, still more preferably from 4 to 6 kgf/mm$^2$. Within this range, the particle can contribute to increasing the film hardness, and particle breakage due to deterioration in brittleness less occurs.

The compressive strength means a compressive strength when the particle diameter (particle size) is 10% deformed. The compressive strength when the particle diameter is 10% deformed is a particle compressive strength (S10 strength), and this is a value obtained by performing a compression test of a resin particle alone up to a load of 1 gf with use of a micro-compression tester, MCT W201, manufactured by Shimadzu Corp., and introducing the load when causing 10% deformation of the particle diameter and the particle diameter before compression into the following formula:

$$S10 \text{ strength (kgf/mm}^2) = 2.8 \times \text{load (kgf)}/(7 \times \text{particle diameter (mm)} \times \text{particle diameter (mm)})$$

The particle for use in the present invention is preferably dispersed in the aqueous phase and/or the oil phase of the coating composition. The method for dispersing the particle on the water side include two methods, that is, (a) a method where a polymer working out to the particle, which is in the form of a solution (for example, by dissolving the polymer in a low boiling point organic solvent), is emulsified and dispersed in an aqueous medium to obtain polymer droplets and the low boiling point organic solvent is removed from the emulsified product, thereby preparing a particle dispersion, and (b) a method where particles of a polymer or the like working out to the particle are previously prepared and a dispersion of the particles in an aqueous medium is prepared while preventing occurrence of "dama" (aggregation). In the present invention, the method (b) which does not discharge a low boiling point organic solvent into the environment is preferred in view of environmental concerns.

In the method for dispersing the particle, the particle may be mechanically dispersed using, for example, a known high-speed stirring device (e.g., disper emulsifier, homomixer, turbine mixer, homogenizer) or ultrasonic emulsifier in the presence of an aqueous medium previously containing a binder as a dispersion aid in an aqueous solvent. At the dispersion, a device for dispersing the particle under reduced pressure rather than atmospheric pressure may be used in combination so as to suppress foaming. The particle is generally added after the dispersion aid used is previously dissolved in the aqueous medium, and the particle in the form of a water dispersion previously obtained by polymerization may be directly added (without passing through a drying step). Also, the dispersion aid may be added to the liquid dispersion during the dispersion process or may be added to the liquid dispersion solution for stabilizing the physical properties after dispersion. In any case, a solvent (e.g., water, alcohol) is generally caused to be present together. The pH may be controlled by an appropriate pH adjusting agent before, after or during the dispersion process.

Other than the mechanically dispersing method, the stability of the particle dispersion after the dispersion process may be increased by controlling the pH. Also, a very small amount of a low boiling point organic solvent may be secondarily used in the dispersion process, and the organic solvent is usually removed after the completion of particle formation.

For the purpose of suppressing precipitation of the light-transparent particle during storage, the dispersion prepared may be stored with stirring or may be stored in a high-viscosity state created with a hydrophilic colloid (for example, a jelly state created using gelatin). Also, for the purpose of preventing proliferation of miscellaneous bacteria during storage, an antiseptic is preferably added.

The dispersion process is preferably performed by adding the binder to account for 5 to 300 mass %, more preferably from 10 to 200 mass %, based on the particle.

A surfactant is preferably added, because when the dispersion above contains a surfactant, the dispersed state is stabilized. The surfactant used here is not particularly limited but is preferably a fluorine compound.

For dispersing the particle on the oil phase side, an oil and an organic solvent are mixed, whereby an emulsion can be produced. The aggregation•dispersion of the oil after coating and drying can be controlled by adjusting the hydrophilic/hydrophobic property on the particle surface (evaluation of aggregation and dispersion with use of toluene or methanol) and adding from 0 to 20 wt % of a hydrophobic polymer (for example, a PMMA polymer having Mw of 75,000) in the oil.

In the present invention, the difference of the refractive index between the binder and the light-transparent particle (refractive index of light-transparent particle–refractive index of binder) is preferably, in terms of the absolute value, from 0.001 to 0.030, more preferably from 0.001 to 0.020, still more preferably from 0.001 to 0.015. If this difference exceeds 0.030, there arises a problem such as film character burring, reduction in dark-room contrast, and surface clouding.

The refractive index of the binder can be quantitatively evaluated by directly measuring the refractive index with an Abbe refractometer or by measuring a spectral reflection spectrum or a spectral ellipsometry. The refractive index of the light-transparent particle is determined as follows. The light-transparent particle is dispersed in an equal amount in solvents prepared by changing the mixing ratio of two kinds of solvents differing in the refractive index and thereby varying the refractive index, the turbidity is measured, and the refractive index of the solvent when the turbidity becomes minimum is measured by an Abbe refractometer.

(Organic Solvent)

In the coating composition of the present invention, when a small amount of an organic solvent drying slower than water and having low solubility in water is used, the strength or adhesion of the coating film can be improved enough for practical use. To describe the process of forming a coating film, after the coating of the O/W emulsion type coating composition on a substrate, the acrylate monomer-rich droplet phase as the oil component undertakes coalescence or emulsion breaking and is homogenized, whereby a layer-like coating film is formed.

At this time, if the droplet has high viscosity or the oil phase is insufficiently homogenized, for example, precipitation or the like of a small-amount component such as initiator is caused, the coating strength decreases. Similarly, if the wettability to the substrate is insufficient or non-uniform, the adhesion decreases. For enhancing the adhesion, it is effective to create a state of the substrate component and the coating film component being interpenetrated with each other, that is, so-called interfacial mixing being brought about.

In the coating composition of the present invention, an organic solvent exhibiting a slower timing of drying than water is added, so that water can preferentially evaporate at the initial stage of drying, that is, a large amount of the organic solvent can remain in the coating composition, and the oil component can be homogenized more successfully. Furthermore, the organic solvent used swells or dissolves the substrate and therefore, brings about interfacial mixing with the substrate, so that adhesion can be imparted.

In order to delay the timing of drying later than water, the boiling point of the organic solvent for use in the present invention is preferably equal to or higher than the boiling point of water, but if the boiling point is excessively high, the organic solvent cannot be completely evaporated and may remain in the coating film to rather decrease the coating strength. Therefore, the boiling point of the organic solvent is preferably from 75 to 220° C., more preferably from 90 to 200° C., and most preferably from 100 to 180° C.

In the organic solvent used for the coating composition of the present invention, the solubility of the organic solvent in 100 g of water is, in view of dispersion stability of the oil phase, preferably from 0 to 30 g, more preferably from 0 to 20 g, still more preferably from 0 to 10 g. As regards the solubility of the organic solvent for use in the present invention with respect to the coating substrate, an organic solvent capable of swelling or dissolving the substrate surface is preferred. Accordingly, an organic solvent according to the kind of the substrate may be appropriately selected from the solvents satisfying the above-described conditions.

From these points of view, examples of the organic solvent for use in the present invention include the following compounds but are not limited thereto. In the case where the substrate is triacetyl cellulose, examples of the organic solvent include methyl ethyl ketone, cyclohexanone, n-butanol, ethyl acetate, butyl acetate and N-methylpyrrolidone. In the case where the substrate is an acrylic polymer, examples of the organic solvent include methyl ethyl ketone, methyl isobutyl ketone, cyclohexanone, toluene, xylene, butyl acetate and alkyl (meth)acrylate. In the case where the substrate is a polystyrene or a styrene-based polymer such as SBR, examples of the organic solvent include methyl ethyl ketone, methyl isobutyl ketone, cyclohexanone, toluene, xylene, butyl acetate, cyclohexane, styrene and methylstyrene.

As for a substrate to which adhesion is substantially difficult to impart, such as polyester-based film including polyethylene terephthalate, the solvent species can be determined after surface-treating the substrate. In the case where the surface is subjected to a glow discharge, corona discharge or plasma treatment, methyl ethyl ketone, cyclohexanone, n-butanol, butyl acetate and the like are preferred, and in the case where an adhesive layer such as acrylic resin and styrene-based resin is provided, a solvent suitable for each adhesive layer can be selected from those described above.

In view of safety or environmental concerns, the compositional ratio of the organic solvent for use in the coating composition of the present invention is preferably smaller within the range of its effect being brought out and is preferably from 1 to 30 mass % (wt %), more preferably from 1 to 20 mass %, still more preferably from 1 to 15 mass %, and most preferably from 1 to 10 mass %.

(Dispersant)

At the time of dispersing the component (A) and other additives for use in the coating composition of the present invention, a dispersant can be used. When the component and additives are dispersed using a dispersant, this is effective for enhancing the stability of the dispersion or enhancing the uniformity of the coating film. In the present invention, a first preferred embodiment of the dispersant which can be used is a dispersant having an anionic group, and a second preferred embodiment is a dispersant containing a nonionic group such as alkylene oxide.

The dispersant containing an anionic group is described below. As for the anionic group, a group having an acidic proton, such as carboxyl group, sulfonic acid group (sulfo), phosphoric acid group (phosphono) and sulfonamide group, and a salt thereof are effective. In particular, a carboxyl group, a sulfonic acid group, a phosphonic acid group, and a salt thereof are preferred, and a carboxyl group and a phosphoric acid group are more preferred.

Out of the anionic dispersants, a dialkylsulfosuccinate is particularly preferred as the dispersant. The kind of the salt includes an alkali metal salt such as lithium salt, sodium salt and potassium salt. The alkyl group includes a linear or branched alkyl group having a carbon number of 3 to 20. Among these, an alkyl group having a carbon number of 5 to 14 is preferred, and a 2-ethylhexyl group and an n-octyl group are more preferred.

Examples of the commercially available dispersant which is preferably used include Phosphanol (e.g., PE-510, PE-610, LB-400, EC-6103, $R^E$-410, all trade names, produced by Toho Chemical Industrial Co., Ltd.), Disperbyk (e.g., -110, -111, -116, -140, -161, -162, -163, -164, -164, -170, -171, all trade names, produced by BYK Chemie Japan) and Ajisper (e.g., PA111, trade name, produced by Ajinomoto Fine-Techno Co., Inc.).

The dispersant preferably further contains a crosslinking or polymerizable functional group. Examples of the crosslinking or polymerizable functional group include an ethylenically unsaturated group (e.g., (meth)acryloyl, allyl, styryl, vinyloxy) capable of undergoing an addition reaction/a polymerization reaction by the effect of a radical species; a cationic polymerizable group (e.g., epoxy, oxatanyl, vinyloxy); and a polycondensation reactive group (e.g., hydrolyzable silyl, N-methylol). Among these, a functional group having an ethylenically unsaturated group is preferred. Examples of the commercially available dispersant include KAYAMER PM-21 (produced by Nippon Kayaku Co., Ltd.), M-5300 (produced by Toagosei Co., Ltd.), Antox MS-60 (produced by Nippon Nyukazai Co., Ltd.), Aquaron HS-10 (produced by Dai-Ichi Kogyo Seiyaku Co., Ltd.) and Aquaron KH-10 (produced by Dai-Ichi Kogyo Seiyaku Co., Ltd.).

The amount of the dispersant used is preferably from 0.1 to 50 mass %, more preferably from 1 to 30 mass %, and most preferably from 2 to 20 mass %, based on the mass of the components in the dispersion excluding water and the volatile organic solvent. Two or more kinds of dispersants may be used in combination.

(Polymer Dispersant)

One another preferred embodiment of the dispersant having an anionic group for use in the present invention is a polymer dispersant which is a copolymer and which has an anionic group and a crosslinking or polymerizable group and has the crosslinking or polymerizable group in the side chain.

The mass average molecular weight (Mw) of the polymer dispersant is not particularly limited but is preferably 1,000 or more, The mass average molecular weight (Mw) of the polymer dispersant is more preferably from 2,000 to 1,000,000, still more preferably from 5,000 to 200,000, yet still more preferably from 10,000 to 100,000.

The polymer dispersant having an anionic group and a crosslinking or polymerizable functional group and having the crosslinking or polymerizable functional group in the side chain has the anionic group in the side chain or at the terminal. As regards the method for introducing an anionic group into the side chain, the synthesis may be performed using a polymer reaction, for example, by a method of polymerizing an anionic group-containing monomer (e.g., (meth)acrylic acid, maleic acid, partially esterified maleic acid, itaconic acid, crotonic acid, 2-carboxyethyl (meth)acrylate, 2-sulfoethyl (meth)acrylate, mono-2-(meth)acryloyloxyethyl phosphate), or a method of causing an acid anhydride to act on a polymer having a hydroxyl group, an amino group or the like.

In the polymer dispersant having an anionic group in the side chain, the composition of the anionic group-containing polymerization unit is from $10^{-4}$ to 100 mol %, preferably from 1 to 50 mol %, more preferably from 5 to 20 mol %, based on all polymerization units.

On the other hand, as regards the method for introducing an anionic group into the terminal, the synthesis may be performed, for example, by a method of conducting a polymerization reaction in the presence of an anionic group-containing chain transfer agent (e.g., thioglycolic acid), or a method of conducting a polymerization reaction using an anionic group-containing polymerization initiator (for example, V-501, trade name, produced by Wako Pure Chemicals Industries, Ltd.). In particular, the polymer dispersant is preferably a polymer dispersant having an anionic group in the side chain.

Examples of the crosslinking or polymerizable functional group include an ethylenically unsaturated group (e.g., (meth)acryloyl, allyl, styryl, vinyloxy) capable of causing an addition reaction/a polymerization reaction by the effect of a radical species; a cationic polymerizable group (e.g., epoxy, oxatanyl, vinyloxy); and a polycondensation reactive group (e.g., hydrolyzable silyl, N-methylol). Among these, a group having an ethylenically unsaturated group is preferred.

The average number of crosslinking or polymerizable functional groups contained per molecule in the polymer dispersant is preferably 2 or more, more preferably 5 or more, still more preferably 10 or more. A plurality of kinds of crosslinking or polymerizable functional groups may be contained in one molecule of the polymer dispersant.

In the polymer dispersant preferably used in the present invention, examples of the polymerization unit having an ethylenically unsaturated group in the side chain include poly-1,2-butadiene and poly-1,2-isoprene structures, and a (meth)acrylic acid ester or amide polymerization unit to which a specific residue (R group in —COOR or —CONHR) is connected. Examples of the specific residue (R group) include —$(CH_2)_n$—$CR^1$=$CR^2R^3$, —$(CH_2O)_n$—$CH_2CR^1$=$CR^2R^3$, —$(CH_2CH_2O)_n$—$CH_2CR^1$=$CR^2R^3$, —$(CH_2)_n$—NH—CO—O—$CH_2CR^1$=$CR^2R^3$, —$(CH_2)_n$—O—CO—$CR^1$=$CR^2R^3$ and $(CH_2CH_2O)_2$—X (wherein $R^1$ to $R^3$ each represents a hydrogen atom, a halogen atom, an alkyl group having a carbon number of 1 to 20, an aryl group, an alkoxy group or an aryloxy group, $R^1$ and $R^2$ or $R^3$ may combine with each other to form a ring, n represents an integer of 1 to 10, and X is a dicyclopentadienyl residue).

Specific examples of the ester residue of R include —$CH_2CH$=$CH_2$, —$CH_2CH_2O$—$CH_2CH$=$CH_2$, —$CH_2CH_2OCOCH$=$CH_2$, —$CH_2CH_2OCOC(CH_3)$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—NH-COO—$CH_2CH$=$CH_2$ and —$CH_2CH_2O$—X (wherein X is a dicyclopentadienyl residue). Specific examples of the amide residue include —$CH_2CH$=$CH_2$, —$CH_2CH_2$—Y (wherein Y is a 1-cyclohexenyl residue), —$CH_2CH_2$—OCO—CH=$CH_2$ and —$CH_2CH_2$—OCO—$C(CH_3)$=$CH_2$.

In the polymer dispersant having an ethylenically unsaturated group, a free radical (a polymerization initiating radical or a radical grown in the polymerization process of a polymerizable compound) is added to the unsaturated bond group to cause an addition polymerization between molecules directly or through polymerization linkage of a polymerizable compound, as a result, crosslinking is formed between molecules, thereby effecting curing. Alternatively, an atom in the molecule (for example, a hydrogen atom on the carbon atom adjacent to the unsaturated bond group) is withdrawn by a free radical to produce a polymer radical, and the polymer radicals are bonded with each other to form crosslinking between molecules, thereby effecting curing.

As for the method of introducing a crosslinking or polymerizable functional group into the side chain, the synthesis may be performed, for example, by a method of copolymerizing a crosslinking or polymerizable functional group-containing monomer (e.g., allyl (meth)acrylate, glycidyl (meth)acrylate, trialkoxysilylpropyl methacrylate), copolymerizing butadiene or isoprene, or copolymerizing a vinyl monomer containing a 3-chloropropionic ester site, and then conducting dehydrochlorination, described in JP-A-3-249653, or a method of introducing a crosslinking or polymerizable functional group through a polymer reaction (for example, a polymer reaction of an epoxy group-containing vinyl monomer with a carboxyl group-containing polymer).

The crosslinking or polymerizable functional group-containing unit may constitute all polymerization units except for the anionic group-containing polymerization unit, but the proportion thereof is preferably from 5 to 50 mol %, more preferably from 5 to 30 mol %, in all crosslinking or polymerization units.

The polymer dispersant preferably used in the present invention may be a copolymer with an appropriate monomer other than the monomer having a crosslinking or polymerizable functional group and an anionic group. The component copolymerized is not particularly limited but is selected from various viewpoints such as dispersion stability, compatibility with other monomer components and strength of coating formed. Preferred examples thereof include methyl (meth)acrylate, n-butyl (meth)acrylate, tert-butyl (meth)acrylate, cyclohexyl (meth)acrylate and styrene.

The polymer dispersant preferably used in the present invention is not particularly limited in the form but is preferably a block copolymer or a random copolymer and in view of cost and easiness of synthesis, more preferably a random copolymer.

Specific examples of the polymer dispersant preferably used in the present invention are set forth below, but the present invention is not limited thereto. Incidentally, these specific examples can be applied in respective copolymers of block copolymer, graft copolymer and random copolymer.

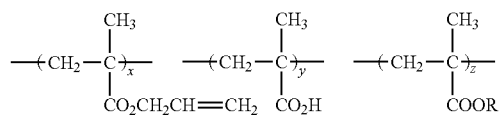

x/y/z indicates a molar ratio

|  | x | y | z | R | Mw |
|---|---|---|---|---|---|
| P-(1) | 80 | 20 | 0 | — | 40,000 |
| P-(2) | 80 | 20 | 0 | — | 110,000 |
| P-(3) | 80 | 20 | 0 | — | 10,000 |
| P-(4) | 90 | 10 | 0 | — | 40,000 |
| P-(5) | 50 | 50 | 0 | — | 40,000 |
| P-(6) | 30 | 20 | 50 | $CH_2CH_2CH_3$ | 30,000 |
| P-(7) | 20 | 30 | 50 | $CH_2CH_2CH_2CH_3$ | 50,000 |
| P-(8) | 70 | 20 | 10 | $CH(CH_3)_3$ | 60,000 |
| P-(9) | 70 | 20 | 10 | —$CH_2CHCH_2CH_2CH_2CH_3$ \| $CH_2CH_3$ | 150,000 |
| P-(10) | 40 | 30 | 30 | 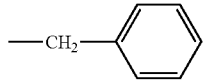 | 15,000 |

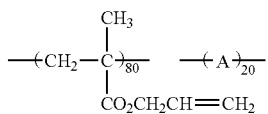
| | A | Mw |
|---|---|---|
| P-(11) | 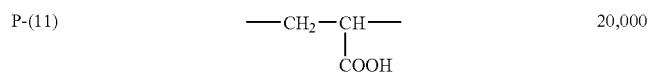 | 20,000 |
| P-(12) | 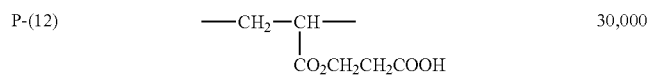 | 30,000 |
| P-(13) | 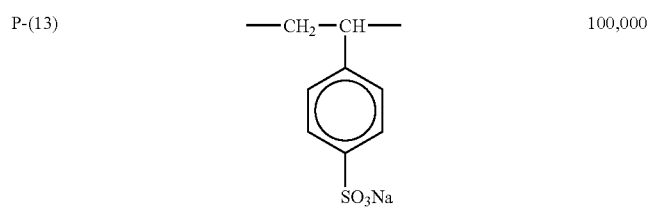 | 100,000 |
| P-(14) | 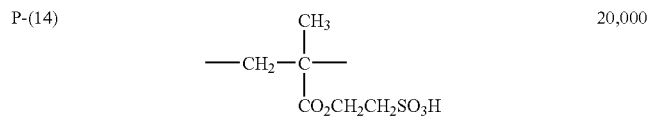 | 20,000 |
| P-(15) | 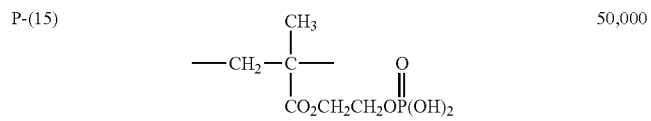 | 50,000 |
| P-(16) | 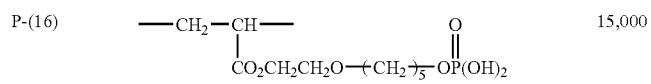 | 15,000 |
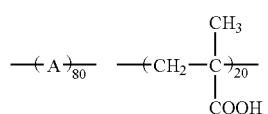
| | A | Mw |
|---|---|---|
| P-(17) | 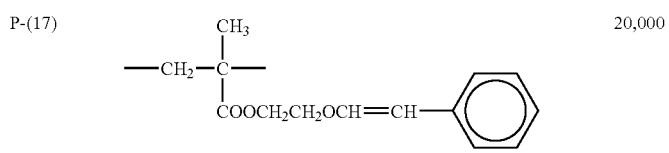 | 20,000 |
| P-(18) | 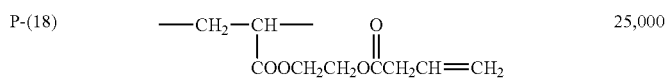 | 25,000 |
| P-(19) | 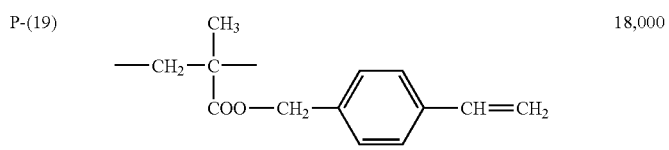 | 18,000 |

-continued

| | | Mw |
|---|---|---|
| P-(20) | —CH₂—CH— with phenyl ring bearing OCCH₂CH=CH₂ (O on C=O) | 20,000 |
| P-(21) | —CH₂—CH—CONHCH₂CH₂OCCH=CH₂ (with C=O) | 35,000 |

$$-(CH_2-C(CH_3)(COOR^1))_x-\ -(CH_2-C(CH_3)(COOH))_y-\ -(CH_2-C(CH_3)(COOR^2))_z-$$

| | R¹ | R² | x | y | z | Mw |
|---|---|---|---|---|---|---|
| P-(22) | CH₂CH₂OCCH=CH₂ (C=O) | C₄H₉(n) | 10 | 10 | 80 | 25,000 |
| P-(23) | CH₂CH₂OCCH=CH₂ (C=O) | C₄H₉(t) | 10 | 10 | 80 | 25,000 |
| P-(24) | CH₂CH₂OCC(CH₃)=CH₂ (C=O) | C₄H₉(n) | 10 | 10 | 80 | 500,000 |
| P-(25) | HO-cyclohexyl-CH₂OCCH=CH₂ | C₄H₉(n) | 10 | 10 | 80 | 23,000 |
| P-(26) | HO-cyclohexyl-CH₂OCCH=CH₂ | C₄H₉(n) | 80 | 10 | 10 | 30,000 |
| P-(27) | HO-cyclohexyl-CH₂OCCH=CH₂ | C₄H₉(n) | 50 | 20 | 30 | 30,000 |
| P-(28) | HO-cyclohexyl-CH₂OCCH=CH₂ | C₄H₉(t) | 10 | 10 | 80 | 20,000 |
| P-(29) | HO-cyclohexyl-CH₂OCCH=CH₂ | CH₂CH₂OH | 50 | 10 | 40 | 20,000 |

| | | | | | | |
|---|---|---|---|---|---|---|
| P-(30) | 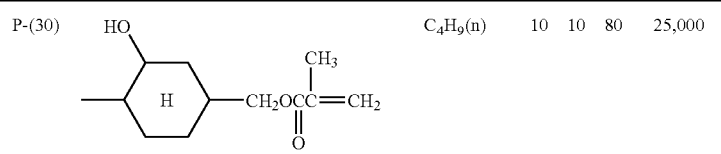 | C₄H₉(n) | 10 | 10 | 80 | 25,000 |
P-(31)
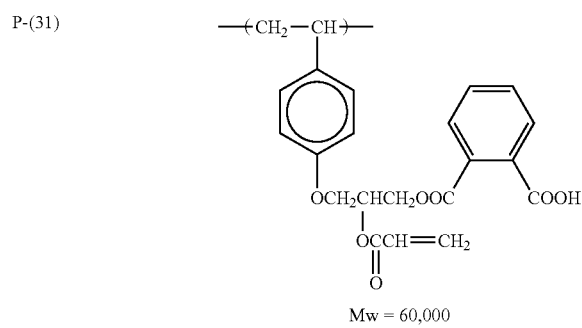
Mw = 60,000
P-(32)
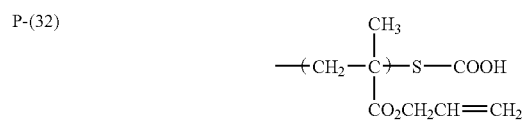
Mw = 10,000
P-(33)
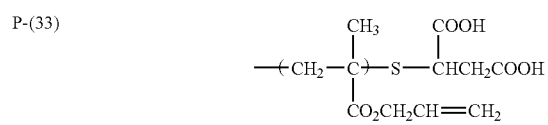
Mw = 20,000
P-(34)
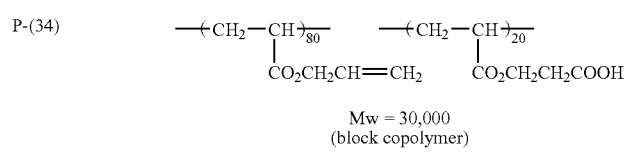
Mw = 30,000
(block copolymer)
P-(35)
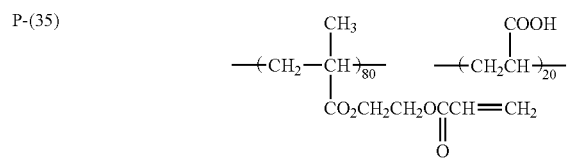
Mw = 15,000
(block copolymer)
P-(36)
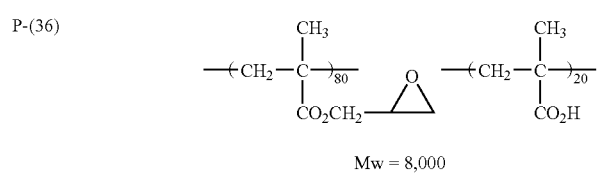
Mw = 8,000
P-(37)
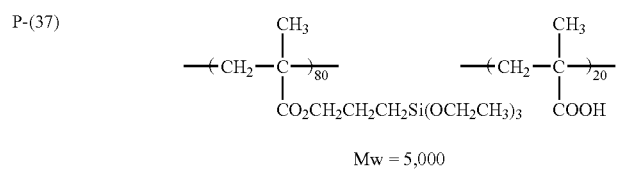
Mw = 5,000

P-(38)

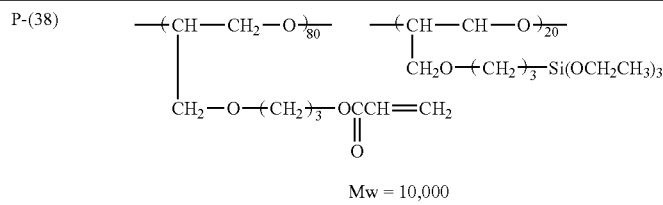

Mw = 10,000

The amount of the polymer dispersant used is preferably from 0.1 to 50 mass %, more preferably from 1 to 30 mass %, and most preferably from 2 to 20 mass %, based on the mass of components in the dispersion excluding water and the volatile organic solvent. Also, two or more kinds of dispersants may be used in combination.

(Dispersant Containing Nonionic Group Such as Alkylene Oxide)

The dispersant containing a nonionic group such as alkylene oxide, which is a second preferred embodiment of the dispersant for use in the present invention, is described below.

Examples of the dispersant containing a nonionic surface active site such as alkylene oxide, for use in the present invention, include a nonionic compound such as polyoxyethylene alkyl ether, polyoxyethylene alkyl phenyl ether, polyoxyethylene-polyoxypropylene block copolymer and polyoxyethylene sorbitan fatty acid ester. A nonionic compound further having an anionic group may also be used. Examples thereof include a compound such as polyoxyethylene alkyl sulfate salt, polyoxyethylene alkylphenyl ether sulfate salt and polyoxyethylene alkyl phosphate salt. The percentage of mass of the alkylene oxide group occupying in the entire mass is preferably from 50 to 100%, more preferably from 70 to 95%. Within this range, a stable O/W type emulsion can be formed.

In the present invention, the dispersant having a nonionic surface active group preferably further contains an ethylenically unsaturated group such as acryloyl group, methacryloyl group, vinyl group and propenyl group, within the molecule from the standpoint of enhancing the strength of coating film. Examples of this compound include Aquaron RN-50 (reactive emulsifier, produced by Dai-Ichi Kogyo Seiyaku Co., Ltd.), Aquaron RN-30 (reactive emulsifier, produced by Dai-Ichi Kogyo Seiyaku Co., Ltd.), Adeka Reasoap NE-5 (reactive emulsifier, produced by Asahi Denka Co., Ltd.), Adeka Reasoap NE-10 (reactive emulsifier, produced by Asahi Denka Co., Ltd.), Adeka Reasoap NE-20 (reactive emulsifier, produced by Asahi Denka Co., Ltd.), Adeka Reasoap NE-30 (reactive emulsifier, produced by Asahi Denka Co., Ltd.) and Adeka Reasoap NE-40 (reactive emulsifier, produced by Asahi Denka Co., Ltd.).

Examples of the compound not having an ethylenically unsaturated group include Pluronic F68 (produced by Asahi Denka Co., Ltd.), Noigen TDS-120 (produced by Dai-Ichi Kogyo Seiyaku Co., Ltd.) Noigen XL-160 (produced by Dai-Ichi Kogyo Seiyaku Co., Ltd.) and DKS NL-350 (produced by Dai-Ichi Kogyo Seiyaku Co., Ltd.).

One dispersant may be used alone, or two or more kinds of dispersants may be used in combination. The amount of the dispersant used is preferably from 0.1 to 50 mass %, more preferably from 1 to 30 mass %, and most preferably from 2 to 20 mass %, based on the mass of the components in the dispersion excluding water and the volatile organic solvent. Also, two or more kinds of dispersants may be used in combination. In the case of using a nonionic dispersant, the above-described anionic dispersant is preferably used in combination. The amount of the anionic dispersant used in combination is preferably from 0.1 to 20 mass %, more preferably from 1 to 150 mass %, and most preferably from 1 to 8 mass %, based on the mass of the components in the dispersion excluding water and the volatile organic solvent.

(Photopolymerization Initiator)

The coating composition of the present invention preferably further contains a photopolymerization initiator in the aqueous phase and/or the oil phase. Examples of the photopolymerization initiator include acetophenones, benzoins, benzophenones, phosphine oxides, ketals, anthraquinones, thioxanthones, azo compounds, peroxides (see, for example, JP-A-2001-139663), 2,3-dialkyldione compounds, disulfide compounds, fluoroamine compounds, aromatic sulfoniums, lophine dimers, onium salts, borate salts, active esters, active halogens, inorganic complexes and coumarins.

Examples of the acetophenones include 2,2-dimethoxyacetophenone, 2,2-diethoxyacetophenone, p-dimethylacetophenone, 1-hydroxy-dimethyl phenyl ketone, 1-hydroxy-dimethyl-p-isopropyl phenyl ketone, 1-hydroxycyclohexyl phenyl ketone, 2-methyl-4-methylthio-2-morpholinopropiophenone, 2-benzyl-2-dimethylamino-1-(4-morpholinophenyl)butanone, 4-phenoxydichloroacetophenone and 4-tert-butyl-dichloroacetophenone.

Specific examples of the active halogens include compounds described in Wakabayashi et al., *Bull Chem. Soc. Japan*, Vol. 42, page 2924 (1969), U.S. Pat. No. 3,905,815, JP-A-5-27830, and M. P. Hutt, *Journal of Heterocyclic Chemistry*, Vol. 1 (No. 3), (1970), particularly a trihalomethyl group-substituted oxazole compound and an s-triazine compound. An s-triazine derivative in which at least one mono-, di- or tri-halogen-substituted methyl group is bonded to the s-triazine ring, is more preferred. Specifically, S-triazine and oxathiazole compounds are known, and examples thereof include 2-(p-meth oxyphenyl)-4,6-bis(trichloromethyl)-s-triazine, 2-(p-methoxyphenyl)-4,6-bis(trichloromethyl)-s-triazine, 2-(p-styrylphenyl)-4,6-bis(trichloromethyl)-s-triazine, 2-(3-Br-4-di(ethyl acetate)amino)phenyl-4,6-bis(trichloromethyl)-s-triazine and 2-trihalomethyl-5-(p-methoxyphenyl)-1,3,4-oxadiazole. Specific preferred examples thereof include compounds described at pp. 14-30 of JP-A-58-15503 and pp. 6-10 of JP-A-55-77742, compound Nos. 1 to 8 described at page 287 of JP-B-60-27673 (the term "JP-B" as used herein means an "examined Japanese patent publication"), compound Nos. 1 to 17 described at pp. 443-444 of JP-A-60-239736, and compound Nos. 1 to 19 described in U.S. Pat. No. 4,701,399.

Specific examples of the active halogens are set forth below.

UVI-1:

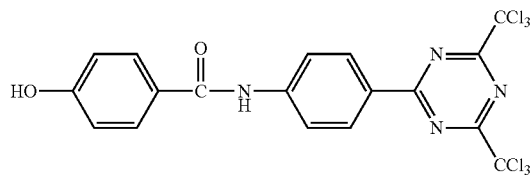

UVI-2:

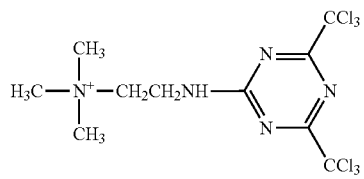

UVI-3:

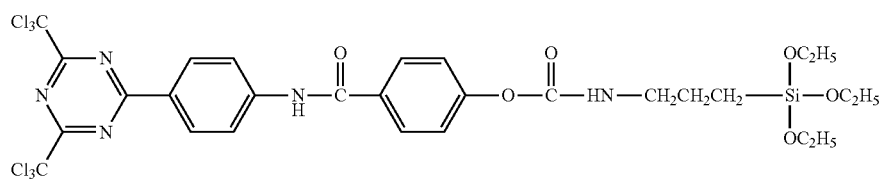

The molecular weight of the photopolymerization initiator is from 200 to 10,000, preferably from 250 to 5,000, more preferably from 350 to 3,000.

In the present invention, the compound having a high molecular weight and less volatilizing from the coating film is preferably an oligomer-type polymerization initiator. The oligomer-type radiation polymerization initiator is not particularly limited as long as it has a site capable of generating a photoradical upon irradiation with radiation. The molecular weight of this polymerization initiator is preferably from 250 to 10,000, more preferably from 350 to 5,000. When the mass average molecular weight is 250 or more, the volatility is low and this is preferred, whereas when the mass average molecular weight is 10,000 or less, a cured film having sufficiently high hardness can be advantageously obtained. Specific examples of the oligomer-type radiation polymerization initiator include an oligo[2-hydroxy-2-methyl-1-{4-(1-methylvinyl)phenyl}propanone] represented by the following formula (5).

Formula (5):

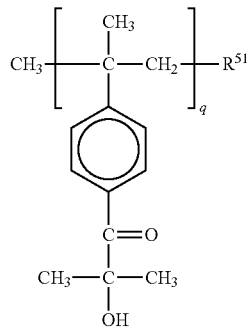

In formula (5), $R^{51}$ represents a monovalent group, preferably a monovalent organic group, and q represents an integer of 2 to 45.

Examples of the commercial product for the oligo[2-hydroxy-2-methyl-1-{4-(1-methylvinyl)phenyl}propanone] represented by formula (5) include "Esacure KIP150" (CAS-No. 163702-01-0, q=4 to 6), "Esacure KIP65LT" (a mixture of "Esacure KIP150" and tripropylene glycol diacrylate), "Esacure KIP100F" (a mixture of "Esacure KIP150" and 2-hydroxy-2-methyl-1-phenylpropan-1-one), "Esacure KT37", "Esacure KT55 (both a mixture of "Esacure KIP150" and a methyl benzophenone derivative), "Esacure KTO46 (a mixture of "Esacure KIP150", a methyl benzophenone derivative and 2,4,6-trimethylbenzoyldiphenylphosphine oxide), and "Esacure KIP75/B" (a mixture of "Esacure KIP150" and 2,2-dimethoxy-1,2-diphenylethan-1-one), trade names, produced by Fratelli Lamberti.

In the present invention, the photopolymerization initiator preferably has high thermal stability. When the thermal stability is high, even in the case of providing a heating step before the curing of the coating film and thereby promoting the removal of remaining water, the polymerization initiator is less decomposed and this is preferred. Examples of the compound having high thermal stability include a photopolymerization initiator having a 7-membered ring imide structure described in JP-A-2005-314633 and a photopolymerization initiator having a 5-membered ring imide structure described in JP-A-2005-314634. The thermal stability can be evaluated by measuring the 5% weight decrease temperature with a differential type differential thermal balance (product name: TG8120, manufactured by Rigaku Corporation) at a temperature elevation rate of 10° C./min in a nitrogen atmosphere. The 5% weight decrease temperature is preferably 200° C. or more, more preferably 250° C. or more, and most preferably 300° C. or more.

The photopolymerization initiators may be used individually or as a mixture. Various examples are also described in

*Saishin UV Koka Gijutsu* (*Latest UV Curing Technologies*), page 159, Technical Information Institute Co., Ltd. (1991), and Kiyomi Kato, *Shigaisen Koka System* (*Ultraviolet Curing System*), pp. 65-148, Sogo Gijutsu Center (1989), and these are useful in the present invention.

Examples of the commercially available photo-polymerization initiator include KAYACURE (e.g., DETX-S, BP-100, BDMK, CTX, BMS, 2-EAQ, ABQ, CPTX, EPD, ITX, QTX, BTC, MCA) produced by Nippon Kayaku Co., Ltd.; IRGACURE (e.g., 651, 184, 500, 819, 907, 369, 1173, 1870, 2959, 4265, 4263) produced by Ciba Specialty Chemicals Corp.; Esacure (e.g., KIP100F, KB1, EB3, BP, X33, KTO46, KT37, KIP150, TZT) produced by Sartomer Company Inc.; and a mixture thereof.

The photopolymerization initiator is preferably used in an amount of 0.1 to 15 parts by mass, more preferably from 1 to 10 parts by mass, per 100 parts by mass of the active energy ray-curable polyfunctional (meth)acrylate having at least three or more (meth)acryloyl groups, contained as (A) in the coating composition of the present invention.

In the present invention, a heating step is preferably provided so as to decrease water remaining in the process of coating and drying the dispersion. The volatilizing property lowers as the molecular weight of the photopolymerization initiator is larger and therefore, a photopolymerization initiator having a high molecular weight is preferably used in combination. The molecular weight of the photopolymerization initiator is preferably from 200 to 10,000, more preferably from 250 to 5,000, and most preferably from 350 to 3,000. In the case of using the photopolymerization initiator having a high molecular weight in combination, the amount used thereof is preferably from 0.1 to 10 parts by mass, more preferably from 1 to 8 parts by mass, based on the polymerizable compound.

In the present invention, photopolymerization initiators differing in the hydrophilicity/hydrophobicity may be used in combination. When a photopolymerization initiator having high hydrophilicity is partially used in combination, the polymerization initiator is unevenly distributed near the surface of the dispersion in which the polymerizable component is dispersed, as a result, the bonding failure at the interface can be improved.

(Thickening Agent)

The coating composition of the present invention may contain a thickening agent. The addition of a thickening agent is preferred because mixing of adjacent layers less occurs in the coating and drying steps and this provides such an effect as that a desired composition can be formed or the surface state failure is improved.

In the present invention, a water-soluble polymer or a water dispersion of polymer is preferably used as the thickening agent, and either a natural product or a synthetic polymer can be successfully utilized.

Specific examples of the water-soluble polymer include a natural product such as starches (e.g., corn starch, starch), seaweed (e.g., agar, sodium alginate), vegetable tacky substance (e.g., gum arabic), animal protein (e.g., glue, casein, gelatin, egg albumen) and fermented tacky substance (e.g., pullulan, dextrin); a semisynthetic polymer such as starchy substance (e.g., soluble starch, carboxyl starch, dextran) and celluloses (e.g., viscose, methyl cellulose, ethyl cellulose, carboxymethyl cellulose, hydroxyethyl cellulose, hydroxypropyl cellulose, hydroxypropylmethyl cellulose); and a synthetic polymer (e.g., polyvinyl alcohol, polyacrylamide, polyvinylpyrrolidone, polyethylene glycol, polypropylene glycol, polyvinyl ether, polyethyleneimine, polystyrene sulfonic acid or copolymer thereof, polyvinylsulfanic acid or copolymer thereof, polyacrylic acid or copolymer thereof, acrylic acid or copolymer thereof, maleic acid copolymer, maleic acid monoester copolymer, acryloylmethylpropanesulfonic acid or copolymer thereof).

Examples of the water dispersion of polymer include a water dispersion of acrylic polymer, a water dispersion of synthetic rubber-based polymer (e.g., styrene-butadiene copolymer), a water dispersion of polyether-based polymer, and a water dispersion of polyurethane-based polymer.

In order not to impair the stability of the emulsion, the content of salts is preferably smaller, and out of those thickening agents, the thickening agent for use in the present invention is preferably a water-soluble polymer which is a nonionic polymer at the same time.

Specific examples of the synthetic water-soluble polymer include polyvinyl alcohol, polyacrylamide, polyvinylpyrrolidone, polyethylene glycol, polypropylene glycol, polyvinyl ether, polyethyleneimine, a polystyrene-sulfonic acid or a copolymer thereof, a polyvinylsulfanic acid or a copolymer thereof, a polyacrylic acid or a copolymer thereof, an acrylic acid or a copolymer thereof, a maleic acid copolymer, a maleic acid monoester copolymer, an acryloylmethylpropanesulfonic acid or a copolymer thereof, carboxymethyl cellulose, hydroxyethyl cellulose, hydroxypropyl cellulose, hydroxypropylmethyl cellulose, an alkali metal salt of carboxymethyl cellulose, and carboxymethyl-hydroxyethyl cellulose. These compounds are described in detail in Shinji Nagatomo (compiler), *Shin Suiyosei Polymer no Oyo to Shijo* (*Applications and Market of Water-soluble Polymers, New Edition*), CMC Shuppan (Nov. 4, 1988).

Among these, a water-soluble polymer selected from a polyvinyl alcohol derivative and a cellulose derivative is more preferred.

In the polyvinyl alcohol derivative, the number average polymerization degree of vinyl alcohol is preferably from 200 to 5,000, more preferably from 1,000 to 4,000. If the number average polymerization degree of the polyvinyl alcohol derivative is decreased, a viscosity suitable for the coating solution can be hardly obtained in the viscosity adjustment of the coating solution, whereas if the number average polymerization degree is increased, aggregation of the solid dispersion or emulsion may be cause by the addition of the polymer to the coating solution.

The polyvinyl alcohol derivative for use in the present invention preferably has a saponification degree of 80 to 100 mol %. If the saponification degree is decreased, the concentration of an aqueous solution for the addition to the coating solution may decrease to fail in obtaining a coating solution having a desired viscosity or the solid dispersion or emulsion may aggregate when the polymer is added to the coating solution.

The polyvinyl alcohol derivative added to the coating solution for use in the present invention is preferably in the form of a solution, more preferably an aqueous solution. The addition in the powder form to the coating solution may cause so-called "mamako" (lump) to worsen the surface state of the coating. The concentration of the aqueous solution is preferably from 1 to 20 mass %. The "aqueous solution" as used herein indicates a solution having a water concentration of 70 to 100% based on the entire mass of the solvent. If the concentration of the aqueous solution is decreased, the viscosity of the coating solution becomes insufficient and the coating may fail in having a smooth surface state.

If the concentration of the aqueous solution is increased, the polyvinyl alcohol derivative may strongly interact with the solid dispersion or emulsion at the preparation of the coating solution to cause aggregation and precipitation. Such a coating solution may give a coating having a surface state where so-called "butsu" (bump) is formed. Also, depending on the solubility of the polyvinyl alcohol derivative in water, a solid matter of polyvinyl alcohol derivative may remain in the produced solution and the remaining solid may worsen the surface state of the coating or worsen the performance of filtration performed at the coating. In order to remove the solid matter remaining in the solution, the aqueous solution is preferably filtered and then added to the coating solution. Incidentally, specific examples of the polyvinyl alcohols include those described later for polyvinyl alcohols.

The dissolution temperature of the aqueous polyvinyl alcohol derivative solution for use in the present invention is preferably from 60 to 100° C., more preferably 70° C. or more. If the dissolution temperature of the polyvinyl alcohol derivative is lowered, a solid matter of polyvinyl alcohol may remain in the solution and the undissolved polyvinyl alcohol derivative may worsen the surface state of the coating or may worsen the performance of filtration performed at the coating. On the other hand, if the dissolution temperature is a high temperature exceeding 100° C., although depending on the solvent component of the solution, in the case of the aqueous solution for use in the present invention, the boiling point of water is 100° C. and therefore, a special facility such as high-pressure steam boiler is required. This may cause a rise in the cost in the production process of the aqueous solution and is not preferred.

The viscosity of the aqueous polyvinyl alcohol derivative solution is preferably from 150 to 250 cP at 25° C. and 5 mass %.

The amount of the water-soluble polymer used as the thickening agent is not particularly limited as long as the viscosity is elevated to an appropriate range when the polymer is added to the coating solution. The concentration in the solution is generally from 0.01 to 30 mass %, preferably from 0.05 to 20 mass %, more preferably from 0.1 to 10 mass %. The viscosity attained by the addition of the water-soluble polymer is, in terms of the increment from the initial viscosity, preferably from 1 to 200 cP, more preferably from 5 to 100 cP. In the measurement, a value measured using a B-type rotary viscometer at 25° C. is used. In general, at the addition to the coating solution or the like, the thickening agent is preferably added in the form of a dilute solution, if possible. Also, sufficient stirring is preferably performed during the addition.

The coating composition of the present invention may contain various surfactants for various purposes such as coating aid, antistatic agent, improvement of slipperiness, emulsion dispersion and prevention of blocking.
(Surfactant)

The surfactant which can be used in the coating composition of the present invention is not particularly limited. Preferred examples of the surfactant which can be used include a nonionic surface active agent such as saponin (steroid type), alkylene oxide derivative (e.g., polyethylene glycol, polyethylene glycol/polypropylene glycol condensate, polyethylene glycol alkylaryl ethers, polyethylene glycol esters, polyethylene glycol sorbitan esters, polyalkylene glycol alkylamines, polyalkylene glycol alkyl amides, polyethylene oxide adducts of silicone), glycidol derivative (e.g., alkenylsuccinic polyglyceride, alkylphenol polyglyceride), fatty acid esters of polyhydric alcohol, and alkyl esters of sugar; an anionic surfactant containing an acidic group (e.g., carboxy group, sulfo group, phospho group, sulfuric ester group, phosphoric ester group), such as alkyl carboxylate, alkyl sulfonate, alkylbenzene sulfonate, alkylnaphthalene sulfonate, alkylsulfuric acid esters, alkylphosphoric acid esters, N-acyl-N-alkyltaurines, sulfosuccinic acid esters, sulfoalkylpolyoxyethylene alkylphenyl ethers and polyoxyethylene alkylphosphoric acid esters; an amphoteric surfactant such as amino acids, aminoalkylsulfonic acids, aminoalkylsulfuric acid esters, aminoalkylphosphoric acid esters, alkylbetaines and amine oxides; and a cationic surfactant such as alkylamine salts, aliphatic or aromatic quaternary ammonium salts, heterocyclic quaternary ammonium salts (e.g., pyridinium, imidazolium) and aliphatic or heterocyclic ring-containing phosphonium or sulfonium salts. Also, when a silicone-containing surfactant such as those described in JP-A-2-18542, page 4, left upper column, lines 5 to right lower column, line 9, F-type surfactant (e.g., F410, F411, F443, F445, F470, F479) produced by Dainippon Ink & Chemicals, Inc., KF640, KF642, KF643 (all produced by Shin-Etsu Chemical Co., Ltd.) and YF3842 (produced by GE Toshiba Silicones Co., Ltd.) is used, excellent leveling property can be exerted.

The amount of the surfactant used per 100 parts by weight of the coating composition may be sufficient if it is from 0.01 to 1 part by weight, but is preferably from 0.01 to 0.5 parts by weight, more preferably from 0.01 to 0.1 part by weight. Two or more kinds of surfactants may be mixed.
<Laminate>

The laminate (film) of the present invention is a laminate comprising a transparent support having thereon a cured layer formed by curing the coating composition of the present invention. The laminate is preferably a laminate for optical film (optical film) or a laminate for antireflection film (antireflection film).

(Layer Construction of Film of the Present Invention)

Figure 2:
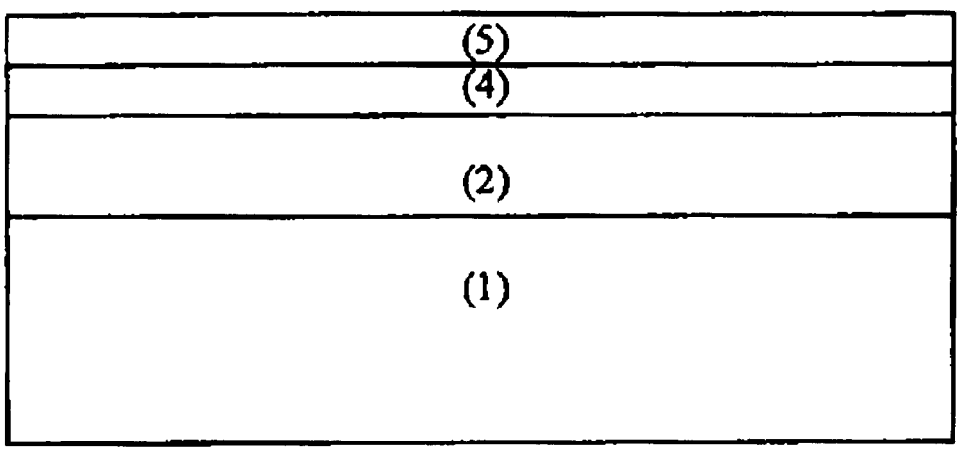
FIG. 2 is a schematic section schematically showing a preferred embodiment of the film of the present invention.
Figure 3:
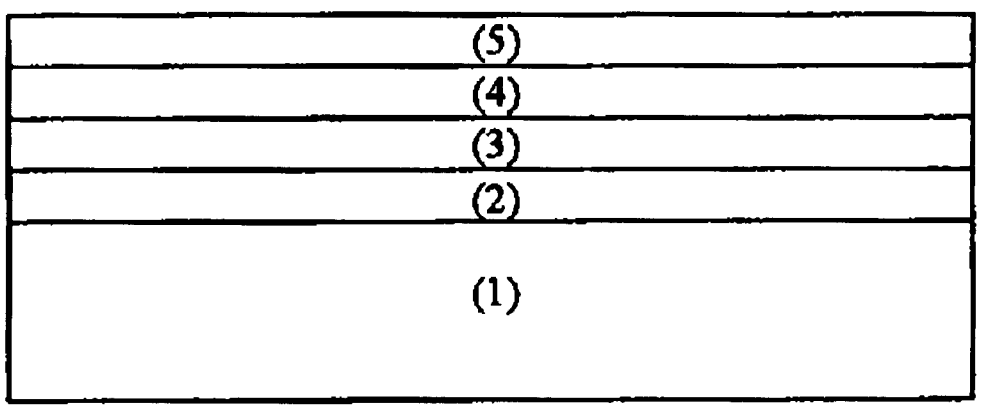
FIG. 3 is a schematic section schematically showing a preferred embodiment of the film of the present invention.

The layer construction of the film of the present invention is not particularly limited as long as it is a laminate structure where a cured layer formed by curing the coating composition of the present invention is present on a transparent support, but examples thereof include the following layer constructions. The coating film obtained by coating the coating composition of the present invention contains an active energy ray-curable polyfunctional (meth)acrylate having at least three or more (meth)acryloyl groups within the molecule and therefore, can be suitably used as a hardcoat layer.

a. Transparent support/hardcoat layer b. Transparent support/hardcoat layer/low refractive index layer (FIG. 1)

c. Transparent support/hardcoat layer/high refractive index layer/low refractive index layer (FIG. 2)

d. Transparent support/hardcoat layer/medium refractive index layer/high refractive index layer/low refractive index layer (FIG. 3)

A film where as in b (FIG. 1), a hardcoat layer is coated on a transparent support and a low refractive index layer is stacked thereon can be suitably used as the antireflection film. When the low refractive index layer 4 is formed on the hardcoat layer to a thickness of around ¼ of the light wavelength, the surface reflection can be decreased by the principle of thin-film interference.

A film where as in c (FIG. 2), a hardcoat layer is coated on a transparent support and a high refractive index layer and a low refractive index layer are stacked thereof can also be suitably used as the antireflection film. Furthermore, when as in d (FIG. 3), a layer construction is established in the order of a transparent support, a hardcoat layer, a medium refractive index layer, a high refractive index layer and a low refractive index layer, the reflectance can be decreased to 1% or less.

Figure 4:
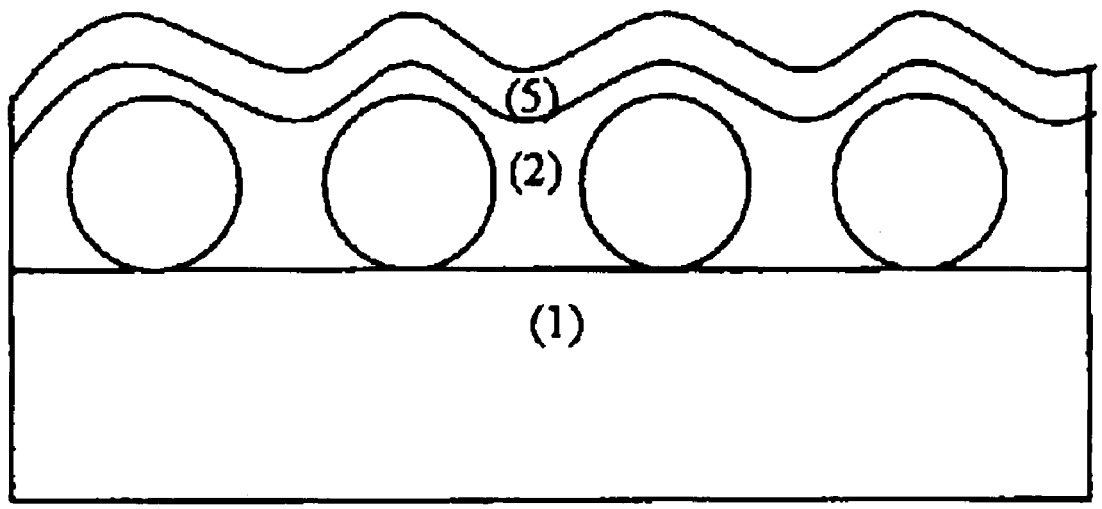
FIG. 4 is a schematic section schematically showing a preferred embodiment of the film of the present invention.
Figure 5:
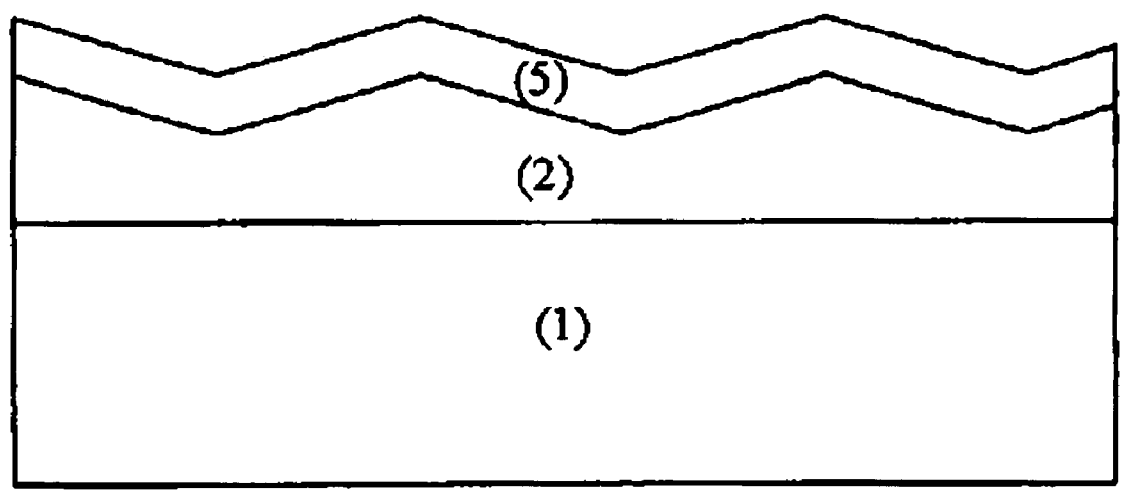
FIG. 5 is a schematic section schematically showing a preferred embodiment of the film of the present invention.

In the constructions of a to d, the hardcoat layer (2) may be an antiglare layer having antiglare property. The antiglare property may be provided by the dispersion of a matte particle as shown in FIG. 4 or by the surface shaping such as embossing shown in FIG. 5. The antiglare layer formed by the dispersion of a matte particle comprises a binder and a light-transparent particle dispersed in the binder. The antiglare layer having antiglare property preferably has both antiglare property and hardcoat property and may be composed of a plurality of layers, for example, from two to four layers.

Examples of the layer which may be provided between the transparent support and a layer closer to the surface side than that or on the outermost surface include an interference unevenness (rainbow unevenness)-preventing layer, an antistatic layer (when, for example, reduction in the surface resistivity from the display side is required or attachment of dust to the surface or the like becomes a problem), another hardcoat layer (when hardness is insufficient only by one hardcoat layer or antiglare layer), a gas barrier layer, a water-absorbing layer (moisture-proofing layer), an adhesion-improving layer and an antifouling layer (contamination-preventing layer).

The refractive indexes of the layers constituting the antiglare antireflection film having an antireflection layer of the present invention preferably satisfy the following relationship:

refractive index of hardcoat layer>refractive index of transparent support>refractive index of low refractive index layer.

(Low Refractive Index Layer)

In the film of the present invention, a low refractive index layer may be used for decreasing the reflectance. The refractive index of the low refractive index layer is preferably from 1.20 to 1.46, more preferably from 1.25 to 1.46, still more preferably from 1.30 to 1.46. The thickness of the low refractive index layer is preferably from 50 to 200 nm, more preferably from 70 to 100 nm. The haze of the low refractive index layer is preferably 3% or less, more preferably 2% or less, and most preferably 1% or less. The strength of the low refractive index layer is specifically, in the pencil hardness test with a load of 500 g, preferably H or more, more preferably 2H or more, and most preferably 3H or more.

In order to improve the antifouling performance of the film of the present invention, the contact angle with water of the low refractive index layer surface is preferably 900 or more, more preferably 950 or more, still more preferably 1000 or more.

The coating composition for the low refractive index layer preferably comprises (A) the above-described fluorine-containing polymer, (B) an inorganic particle and (C) an organosilane compound.

In the low refractive index layer, a binder is used for dispersing and immobilizing the inorganic particle. As for the binder, the binder described above for the hardcoat layer may be used, but a fluorine-containing polymer or fluorine-containing sol/gel material ensuring the low refractive index of the binder itself is preferably used. The fluorine-containing polymer or fluorine-containing sol/gel material is preferably a material which is crosslinked by the effect of heat or ionizing radiation and allows for formation of a low refractive index layer of which surface has a dynamic friction coefficient of 0.03 to 0.30 and a contact angle with water of 85 to 1200.

<Transparent Support>

The transparent support of the film of the present invention is not particularly limited as long as it is a transparent medium swellable or dissolvable with the organic solvent of the present invention, and may be a transparent resin film, a transparent resin plate, a transparent resin sheet or a transparent glass. Examples of the transparent resin film which can be used include a cellulose acylate film (e.g., cellulose triacetate film (refractive index: 1.48), cellulose diacetate film, cellulose acetate butyrate film, cellulose acetate propionate film), a polyethylene terephthalate film, a polyethersulfone film, a polyacrylic resin film, a polyurethane-based resin film, a polyester film, a polycarbonate film, a polysulfone film, a polyether film, a polymethylpentene film, a polyether ketone film and a (meth)acrylonitrile film.

The thickness of the transparent support is usually on the order of 25 to 1,000 µm, preferably from 25 to 250 µm, more preferably from 30 to 90 µm.

The support may have an arbitrary width but in view of handling, yield ratio and productivity, the width is usually from 100 to 5,000 mm, preferably from 800 to 3,000 mm, more preferably from 1,000 to 2,000 mm.

The surface of the transparent support is preferably smooth, and the average roughness Ra value is preferably 1 µm or less, more preferably from 0.0001 to 0.5 µm, still more preferably from 0.001 to 0.1 µm.

(Cellulose Acylate Film)

Among those various films, a cellulose acylate film assured of high transparency, less optical birefringence and easy production and generally used as a protective film of polarizing plate is preferred.

As regards the cellulose acylate film, various techniques for improving mechanical property, transparency, flatness and the like are known, and the technique described in *JIII Journal of Technical Disclosure*, No. 2001-1745 can be used in the present invention as a known art.

In the present invention, among cellulose acylate films, a cellulose triacetate film is preferred, and a cellulose acetate having an acetylation degree of 59.0 to 61.5% is preferably used for the cellulose acylate film. The acetylation degree means the amount of acetic acid bonded per unit mass of cellulose. The acetylation degree is determined according to the measurement and calculation of acetylation degree in ASTM:D-817-91 (Test Method of Cellulose Acetate, etc.).

The viscosity average polymerization degree (DP) of the cellulose acylate is preferably 250 or more, more preferably 290 or more.

Also, in the cellulose acylate for use in the present invention, the Mw/Mn (Mw is the mass average molecular weight and Mn is the number average molecular weight) value by gel permeation chromatography is preferably close to 1.0, in other words, the molecular weight distribution is preferably narrow. Specifically, the Mw/Mn value is preferably from 1.0 to 1.7, more preferably from 1.3 to 1.65, and most preferably from 1.4 to 1.6.

In general, the hydroxyl groups at the 2-, 3- and 6-positions of the cellulose acylate are not evenly distributed in ⅓ portions of the entire substitution degree, but the substitution degree of the hydroxyl group at the 6-position tends to be small. In the present invention, the substitution degree of the hydroxyl group at the 6-position of the cellulose acylate is preferably larger than those at the 2-position and 3-position.

The hydroxyl group at the 6-position, which is substituted by an acyl group, preferably accounts for 32% or more, more preferably 33% or more, still more preferably 34% or more, based on the entire substitution degree. Furthermore, the substitution degree of the acyl group at the 6-position of the cellulose acylate is preferably 0.88 or more. The hydroxyl group at the 6-position may be substituted by an acyl group having a carbon number of 3 or more, such as propionyl group, butyroyl group, valeroyl group, benzoyl group or acryloyl group, other than an acetyl group. The substitution degree at each position can be determined by NMR.

As regards the cellulose acylate for use in the present invention, cellulose acetates obtained by the methods described in JP-A-11-5851, "Example" and "Synthesis Example 1" of paragraphs [0043] and [0044], "Synthesis Example 2" of paragraphs [0048] and [0049], and "Synthesis Example 3" of paragraphs [0051] and [0052], can be used.
(Polyester Film)

In the present invention, a polyester film may also be preferably used because of its excellence in all of transparency, mechanical strength, flatness, chemical resistance and moisture resistance. Among the polyester films, a polyethylene terephthalate is inexpensive and is preferably used.

The polyethylene terephthalate film is more preferably subjected to an easy adhesion treatment so as to further enhance the adhesion strength between the polyethylene terephthalate film and the coating film formed thereon by coating the coating composition of the present invention. Examples of the easy adhesion treatment include a surface treatment such as glow discharge treatment, corona discharge treatment and plasma treatment, and a treatment of providing an adhesive layer such as acrylic resin or styrene-based resin. Examples of the commercially available optical PET film with an easy adhesion layer include COSMOSHINE A4100 and A4300 produced by Toyobo Co., Ltd.

<Production Method of Laminate of the Present Invention>

The production method of a laminate (film) of the present invention is a method for producing a laminate comprising a transparent support having thereon a layer formed by curing a coating composition, and this production method of a laminate comprises a step of coating the coating composition of the present invention and a step of drying the coating.
(Coating Method)

The layers of the film of the present invention each can be formed by the following methods, but the present invention is not limited to these methods. A known method may be used, such as dip coating method, air knife coating method, curtain coating method, roller coating method, wire bar coating method, gravure coating method, extrusion coating method (die coating method) (see, U.S. Pat. No. 2,681,294, JP-A-2003-200097 and JP-A-2003-211052), slide costing method and microgravure coating method. Among these, a microgravure coating method and a die coating method are preferred.

The microgravure coating method for use in the present invention is a coating method characterized in that a gravure roll having a diameter of about 10 to 100 mm, preferably from about 20 to 50 mm, and having a gravure pattern engraved on the entire circumference is rotated below the transparent support in the direction reverse to the transparent support-transporting direction and at the same time, a surplus coating solution is scraped off from the surface of the gravure roll by a doctor blade, whereby a constant amount of the coating solution is transferred to and coated on the bottom surface of the transparent support at the position where the top surface of the transparent support is in a free state. A roll-form transparent support is continuously unrolled and on one side of the unrolled transparent support, at least one layer out of the layers from the light-diffusing layer to the low refractive index layer containing a fluorine-containing olefin-based polymer can be coated by the microgravure coating method.

As for the conditions at the coating by the microgravure coating method, the number of lines in the gravure pattern engraved on the gravure roll is preferably from 50 to 800 lines/inch, more preferably from 100 to 300 lines/inch, the depth of the gravure pattern is preferably from 1 to 600 μm, more preferably from 5 to 200 μm, the rotation number of the gravure roll is preferably from 3 to 800 rpm, more preferably from 5 to 200 rpm, and the transparent support transportation speed is preferably from 0.5 to 100 m/min, more preferably from 1 to 50 m/min.

In order to supply the film of the present invention with high productivity, an extrusion method (die coating method) is preferably used.
(Drying)

After the coating solution is coated on the transparent support directly or through another layer, the film of the present invention is preferably transported in the form of a web to a heated zone for drying water and the organic solvent.

As for the method of drying water and the organic solvent, various known techniques may be utilized. Specific examples thereof include those described in JP-A-2001-286817, JP-A-2001-314798, JP-A-2003-126768, JP-A-2003-315505 and JP-A-2004-34002.

The temperature in the drying zone is preferably from 25 to 140° C. and it is preferred that the temperature in the first half of the drying zone is relatively low and the temperature in the second half is relatively high. However, the temperature is preferably not more than a temperature at which the components other than water and the organic solvent contained in the coating composition for each layer start volatilizing. For example, some commercially available photopolymerization initiators, which are used in combination with an ultraviolet curable resin, volatilize by about several tens of percent within several minutes in warm air at 120° C., and some monofunctional or bifunctional acrylate monomers or the like allow progress of their volatilization in warm air at 100° C. In such a case, the drying zone temperature is preferably not more than a temperature at which the components other than the organic solvent contained in the coating composition for each layer start volatilizing.

In order to prevent uneven drying, the drying air after coating the coating composition for each layer on the transparent support is preferably blown at a speed of 0.1 to 2 m/sec on the coating film surface while the solid content concentration of the coating composition is from 1 to 50%.

Also, in the drying zone after coating the coating composition for each layer on the transparent support, the temperature difference between the transparent support and a transportation roll in contact with the surface opposite the coated surface of the transparent support is preferably set to be from 0 to 20° C., because uneven drying due to uneven heat transfer on the transportation roll can be prevented.
(Curing)

After drying water and the organic solvent, the coating film may be cured by passing the film of the present invention in the form of a web through a zone for curing each coating film with ionizing radiation and/or heat.

The ionizing radiation is not particularly limited and according to the kind of the curable composition for forming a coating, the radiation may be appropriately selected from ultraviolet ray, electron beam, near ultraviolet ray, visible light, near infrared ray, infrared ray, X-ray and the like. Among these, ultraviolet ray and electron beam are preferred, and ultraviolet is more preferred because the handling is easy and a high energy can be easily obtained.

As regards the light source of emitting ultraviolet ray for photopolymerizing an ultraviolet-reactive compound, any light source may be used as long as it emits ultraviolet ray. Examples of the light source which can be used include a low-pressure mercury lamp, a medium-pressure mercury lamp, a high-pressure mercury lamp, an ultrahigh-pressure mercury lamp, a carbon arc lamp, a metal halide lamp and a xenon lamp. Furthermore, an ArF excimer laser, a KrF excimer laser, an excimer lamp, a synchrotron radiation light source and the like may also be used. Among these, an ultrahigh-pressure mercury lamp, a high-pressure mercury lamp, a low-pressure mercury lamp, a carbon arc, a xenon arc and a metal halide lamp can be preferably used.

Examples of the electron beam include electron beams having an energy of 50 to 1,000 keV, preferably from 100 to 300 keV, emitted from various electron beam accelerators such as Cockroft-Walton type, Van de Graff type, resonance transformer type, insulating core transformer type, linear type, dynamitron type and high frequency type.

The irradiation condition (irradiation light intensity) of the ionizing radiation is preferably 10 mJ/cm$^2$ or more, more preferably from 50 to 10,000 mJ/cm$^2$, still more preferably from 50 to 2,000 mJ/cm$^2$. At this time, the irradiation dose distribution in the width direction of the web is preferably, including both edges, from 50 to 100%, more preferably from 80 to 100%, based on the maximum irradiation dose in the center.

In the present invention, at least one layer stacked on the support is preferably cured by a step of irradiating ionizing radiation and at the same time, irradiating the ionizing radiation in an atmosphere having an oxygen concentration of 10 vol % or less for 0.5 seconds or more from the initiation of ionizing radiation irradiation in the state of being heated at a film surface temperature of 60° C. or more. It is also preferred to heat the coating in an atmosphere having an oxygen concentration of 3 vol % or less simultaneously with and/or successively to the irradiation of ionizing radiation. In particular, the low refractive index layer which is an outermost layer and has a small film thickness is preferably cured by this method. The curing reaction is accelerated by the heat, and a coating excellent in the physical strength and chemical resistance can be formed.

The time for which the ionizing radiation is irradiated is preferably from 0.7 to 60 seconds, more preferably from 0.7 to 10 seconds. The region from 0.7 to 60 seconds is preferred, because the curability of the coating can be ensured, the equipment is not excessively large, and the amount of the inert gas used is in the allowable range.

In the crosslinking or polymerization reaction of the ionizing radiation-curable compound, the oxygen concentration in the atmosphere is preferably from 0.001 to 6 vol %, more preferably from 0.003 to 4 vol %, still more preferably from 0.004 to 2 vol %, and most preferably from 0.005 to 1 vol %. When the oxygen concentration is from 0.001 to 6 vol %, this is preferred because the curability of the coating can be ensured and the amount of the inert gas used is in the allowable range.

As for the means to reduce the oxygen concentration to 10 vol % or less, replacement of the atmospheric air (nitrogen concentration: about 79 vol %, oxygen concentration: about 21 vol %) with another gas is preferred, and replacement with nitrogen (nitrogen purging) is more preferred.

When the conditions are set such that the inert gas is supplied to the ionizing radiation irradiation chamber and at the same time, slightly blown out to the web inlet side of the irradiation chamber, the carry-over air associated with the web transportation can be discharged to effectively decrease the oxygen concentration in the reaction chamber and at the same time, the substantial oxygen concentration on the extreme surface greatly susceptible to curing inhibition by oxygen can be decreased. The direction to which the inert gas flows on the web inlet side of the irradiation chamber can be controlled by adjusting the balance between air supply and air discharge in the irradiation chamber. Blowing of the inert gas directly on the web surface is also preferred as the method for removing the carry-over air.

Furthermore, when a pre-chamber is provided before the reaction chamber and the oxygen on the web surface is previously eliminated, the curing can proceed more efficiently. In order to efficiently use the inert gas, the gap between the side surface constituting the web inlet side of the ionizing radiation reaction chamber or pre-chamber and the web surface is preferably from 0.2 to 15 mm, more preferably from 0.2 to 10 mm, and most preferably from 0.2 to 5 mm. However, for continuously producing the web, the web needs to be joined and spliced and a method of laminating the webs by using a bonding tape or the like is widely employed for the joining. Therefore, when the gap between the inlet surface of the ionizing radiation reaction chamber or pre-chamber and the web is too small, there arises a problem that the bonding member such as bonding tape is hung up. To solve this problem, in the case of forming a narrow gap, at least a part of the inlet surface of the ionizing radiation reaction chamber or pr-chamber is preferably made movable, so that the gap can be enlarged for the thickness of the bonded part when the bonded part enters the chamber. This construction may be realized, for example, by a method where the inlet surface of the ionizing radiation reaction chamber or pre-chamber is made movable back and forth in the running direction and moved back and forth to enlarge the gap when the bonded part passes therethrough, or a method where the inlet surface of the ionizing radiation reaction chamber or pre-chamber is made movable perpendicularly to the web surface and moved vertically to enlarge the gap when the bonded part passes therethrough.

At the curing, the film surface is preferably heated at 60 to 170° C. Heating at less than 60° C. results in insufficient curing, and heating at more than 170° C. causes a problem such as deformation of substrate. The heating temperature is more preferably from 60 to 100° C. The temperature on the film surface means a temperature on the surface of a layer intended to cure. Also, the time from the initiation of UV irradiation until the film reaches the above-described temperature is preferably from 0.1 to 300 seconds, more preferably 10 seconds or less. If the time for which the temperature on the film surface is kept at the above-described temperature is too short, the reaction of the curable composition for forming a coating cannot be accelerated, whereas if too long, the optical performance of the film is deteriorated and also, there arises a problem in view of production, such as large equipment.

The heating method is not particularly limited but, for example, a method of contacting the film with a heated roll, a method of blowing heated nitrogen, or a method of irradiating far infrared ray or infrared ray is preferred. A method of performing heating by flowing a medium such as warm water or steam/oil in a rotating metal roll described in Japanese Patent 2523574 may also be used. As for the heating means, a dielectric heating roll or the like may also be used.

The ultraviolet ray may be irradiated every time when a plurality of constituent layers each is formed or may be irradiated after the layers are stacked. Alternatively, some of these layers may be irradiated in combination. In view of productivity, the ultraviolet ray is preferably irradiated after stacking multiple layers.

In the present invention, at least one layer stacked on the transparent support may be cured by a plurality of ionizing radiation irradiations. In this case, at least twice ionizing radiation irradiations are preferably performed in continuous reaction chambers where the oxygen concentration does not exceed 3 vol %. By performing a plurality of ionizing radiation irradiations in reaction chambers having the same low oxygen concentration, the reaction time necessary for curing can be effectively ensured. Particularly, in the case of elevating the production speed for high productivity, a plurality of ionizing radiation irradiations become necessary for ensuring an ionizing radiation energy necessary for the curing reaction.

In the case where the curing percentage (100−residual functional group content) of a layer becomes a certain value less than 100%, when another layer is provided thereon and cured by means of ionizing radiation and/or heat, the curing percentage of the lower layer is preferably higher than that before providing the upper layer, because the adhesion property between the lower layer and the upper layer is improved.

<Polarizing Plate>

The polarizing plate of the present invention is a polarizing plate comprising a polarizing film and protective films located on both sides of the polarizing film, wherein at least one of the protective films is the laminate (film) of the present invention.

(Production of Polarizing Film)

In the polarizing plate of the present invention, the film of the present invention is used as one protective film and as for the other protective film, a normal cellulose acetate film may be used, but a cellulose acetate film produced by the above-described solution film-forming method and stretched in the width direction of a rolled film form at a draw ratio of 10 to 100% is preferably used.

Furthermore, in the polarizing plate of the present invention, it is preferred that one surface is an anti-reflection film and the other protective film is an optical compensation film having an optically anisotropic layer comprising a liquid crystalline compound.

The polarizing film includes an iodine-based polarizing film, a dye-based polarizing film using a dichroic dye, and a polyene-based polarizing film. The iodine-based polarizing film and the dye-based polarizing film are generally produced using a polyvinyl alcohol-based film.

The slow axis of the transparent support or cellulose acetate film of the antireflection film and the transmission axis of the polarizing film are arranged to run substantially in parallel.

The moisture permeability of the protective film is important for the productivity of the polarizing plate. The polarizing film and the protective film are laminated with an aqueous adhesive, and the solvent of this adhesive diffuses in the protective film and is thereby dried. As the moisture permeability of the protective film is higher, the drying rate and in turn the productivity are more elevated, but if the moisture permeability is excessively high, moisture enters into the polarizing film depending on the environment (at high humidity) in which the liquid crystal display device is used, and the polarizing ability decreases.

The moisture permeability of the protective film is determined, for example, by the thickness of transparent support or polymer film (and polymerizable liquid crystal compound), the free volume or the hydrophilicity/hydro-phobicity.

In the case where the film of the present invention is used as the protective film of the polarizing plate, the moisture permeability is preferably from 100 to 1,000 g/m$^2$•24 hrs, more preferably from 300 to 700 g/m$^2$•24 hrs.

In the case of film production, the thickness of the transparent support can be adjusted by the lip flow rate and the line speed or by stretching or compression. The moisture permeability varies depending on the main raw material used and therefore, can be adjusted to a preferred range by controlling the thickness.

In the case of film production, the free volume of the transparent support can be adjusted by the drying temperature and time.

Also in this case, the moisture permeability varies depending on the main raw material used and therefore, the moisture permeability can be adjusted to a preferred range by controlling the free volume.

The hydrophilicity/hydrophobicity of the transparent support can be adjusted by an additive. The moisture permeability is elevated by adding a hydrophilic additive to the above-described free volume, and conversely, the moisture permeability can be lowered by adding a hydrophobic additive.

A polarizing plate having an optically compensating ability can be produced with high productivity at a low cost by independently controlling the moisture permeability.

The polarizing film may be a known polarizing film, or a polarizing film cut out from a lengthy polarizing film with the absorption axis of the polarizing film being neither parallel nor perpendicular to the longitudinal direction may be used. The lengthy polarizing film with the absorption axis of the polarizing film being neither parallel nor perpendicular to the longitudinal direction is produced by the following method.

This is a polarizing film obtained by stretching a continuously fed polymer film while holding its both edges with holding means and applying a tension and can be produced by a stretching method of stretching the film to from 1.1 to 20.0 times at least in the film width direction, moving the holding devices at both edges of the film to create a difference in the traveling speed of 3% or less in the longitudinal direction, and bending the film traveling direction in the state of the film being held at both edges, such that the angle made by the film traveling direction at the outlet in the step of holding both edges of the film and the substantial stretching direction of the film is inclined at 20 to 70°. Particularly, a polarizing film produced with an inclination angle of 45° is preferred in view of productivity.

The stretching method of a polymer film is described in detail in JP-A-2002-86554 (paragraphs [0020] to [0030]).

It is also preferred that out of two protective films of a polarizer, the film other than the antireflection film is an optical compensation film having an optical compensation layer comprising an optically anisotropic layer. The optical compensation film (phase difference film) can improve the viewing angle properties on a liquid crystal display screen.

The optical compensation film may be a known optical compensation film, but from the standpoint of enlarging the viewing angle, the optical compensation film described in JP-A-2001-100042 is preferred.

<Image Display Device>

The image display device of the present invention is an image display device having the laminate or polarizing plate (film of the present invention) of the present invention. Examples of the image display device include a liquid crystal display (LCD), a plasma display panel (PDP), an electroluminescent display (ELD) and a cathode ray tube display (CRT). The film of the present invention can be used for the image display device and is preferably used as the outermost surface layer of the display (image display part) of the image display device.

(Liquid Crystal Display Device)

The liquid crystal display device comprises a liquid crystal cell and two sheets of polarizing plates disposed on both sides of the liquid cell, and the liquid crystal cell carries a liquid crystal between two sheets of electrode substrates. Furthermore, one sheet of optically anisotropic layer is disposed between the liquid crystal cell and one polarizing plate, or two sheets of optically anisotropic layer are sometimes disposed, that is, one between the liquid crystal cell and one polarizing plate and another between the liquid crystal cell and another polarizing plate.

The liquid crystal cell is preferably a TN mode, a VA mode, an OCB mode, an IPS mode or an ECB mode.

In the TN-mode liquid crystal cell, rod-like liquid crystalline molecules are oriented substantially in the horizontal alignment at the time of not applying a voltage and furthermore, twisted at an angle of 60 to 120°. The TN-mode liquid crystal cell is most frequently utilized in a color TFT liquid crystal display device and described in a large number of publications.

In the VA-mode liquid crystal cell, rod-like liquid crystalline molecules are oriented substantially in the vertical alignment at the time of not applying a voltage. The VA-mode liquid crystal cell includes (1) a VA-mode liquid crystal cell in a narrow sense where rod-like liquid crystalline molecules are oriented substantially in the vertical alignment at the time of not applying a voltage and oriented substantially in the horizontal alignment at the time of applying a voltage (described in JP-A-2-176625); (2) an (MVA-mode) liquid crystal cell where the VA mode is modified to a multi-domain system for enlarging the viewing angle (described in SID97, Digest of Tech. Papers (preprints), 28, 845 (1997)); (3) an (n-ASM-mode) liquid crystal cell where rod-like liquid crystalline molecules are oriented substantially in the vertical alignment at the time of not applying a voltage and oriented in the twisted multi-domain alignment at the time of applying a voltage (described in preprints of Nippon Ekisho Toronkai (Liquid Crystal Forum of Japan), 58-59 (1998)); and (4) a SURVAIVAL-mode liquid crystal cell (reported in LCD International 98).

The OCB-mode liquid crystal cell is a liquid crystal cell of bend orientation mode where rod-like liquid crystalline molecules are oriented substantially in the reverse direction (symmetrically) between upper portion and lower portion of the liquid crystal cell, and this is described in U.S. Pat. Nos. 4,583,825 and 5,410,422. Since rod-like liquid crystalline molecules are symmetrically oriented between upper portion and lower portion of the liquid crystal cell, the liquid crystal cell of bend orientation mode has an optically self-compensating ability. Accordingly, this liquid crystal mode is called an OCB (optically compensatory bend) liquid crystal mode. A liquid crystal display device of bend orientation mode is advantageous in that the response speed is fast.

The IPS-mode liquid crystal cell employs a system of switching the nematic liquid crystal by applying a transverse electric field thereto, and this is described in detail in *Proc. IDRC* (*Asia Display* '95), pp. 577-580 and ibid., pp. 707-710.

In the ECB-mode liquid crystal cell, rod-like liquid crystalline molecules are oriented substantially in the horizontal alignment at the time of not applying a voltage. The ECB mode is one of liquid crystal display modes having a simplest structure and is described in detail, for example, in JP-A-5-203946.

(Displays Other than Liquid Crystal Display Device)

The film of the present invention can be used for a plasma display panel (PDP), a touch panel and an organic EL device.

The plasma display panel (PDP) is generally composed of a gas, a glass substrate, an electrode, an electrode lead material, a thick print material and a fluorescent material. As for the glass substrate, two sheets of front glass substrate and rear glass substrate are used. An electrode and an insulating layer are formed on the two glass substrates, and a fluorescent layer is further formed on the rear glass substrate. The two glass substrates are assembled, and a gas is sealed therebetween.

The plasma display panel (PDP) is already available on the market. The plasma display panel is described in JP-A-5-205643 and JP-A-9-306366.

In some cases, a front panel is disposed on the front surface of the plasma display panel. The front panel preferably has sufficiently high strength for protecting the plasma display panel. The front panel may be disposed with spacing from the plasma display panel or may be laminated directly to the plasma display body. In an image display like the plasma display panel, the optical filter can be laminated directly to the display surface. In the case where a front panel is provided in front of the display, the optical filter may be laminated to the front side (outer side) or rear side (display side) of the front panel.

The film of the present invention can be applied to a touch panel and may be used in the form described, for example, in JP-A-5-127822 and JP-A-2002-48913.

The film of the present invention can be used as a substrate (substrate film) or protective film of an organic EL device or the like. In the case of using the film of the present invention for an organic EL device or the like, the contents described, for example, in JP-A-11-335661, JP-A-11-335368, JP-A-2001-192651, JP-A-2001-192652, JP-A-2001-192653, JP-A-2001-335776, JP-A-2001-247859, JP-A-2001-181616, JP-A-2001-181617, JP-A-2002-181816, JP-A-2002-181617 and JP-A-2002-056976 may be applied. Furthermore, the contents described in JP-A-2001-148291, JP-A-2001-221916 and JP-A-2001-231443 are preferably used in combination.

EXAMPLES

The present invention is described in greater detail by referring to Examples, but the present invention is not limited to these Examples.

Synthesis Example 1

Into a flask equipped with a stirrer, a thermometer, an air blowing tube and a reflux condenser, 226 parts of HMDI trimer (Coronate HX, trade name, produced by Nippon Polyurethane Industry Co., Ltd.), 349 parts of pentaerythritol triacrylate, 0.7 parts of 4-methoxyphenol and 0.01 part of a polymerization inhibitor (Q-1301, trade name, produced by Wako Pure Chemical Industries, Ltd.) were charged. Subsequently, 0.14 parts of stannous octylate was charged thereinto with stirring while blowing air, and the system was then heated to 75 to 80° C. and kept warm for 1.5 hours. Thereafter, 125 parts of polyethylene glycol monomethyl ether (Methoxy PEG#400, trade name, produced by Toho Chemical Industrial Co., Ltd.) was added, and the residual isocyanate group in the HMDI trimer and the hydroxyl group in the polyethylene glycol monomethyl ether were reacted to prepare Polyurethane Acrylate UA-1.

(Preparation of O/W Emulsion Type Coating Composition HC-1)

20 Parts of cyclohexanone and 2.4 parts of a photopolymerization initiator (Irgacure 184, trade name, produced by Ciba-Geigy Corp.) were added to 77.6 parts of Polyurethane Acrylate UA-1, and the resultant was stirred until it became uniform and then dispersed by adding 100 parts of deionized water under stirring to obtain O/W Emulsion Type Coating Composition HC-1 having a nonvolatile content of 40%.

(Preparation of O/W Emulsion Type Coating Composition HC-2)

77.6 Parts of Polyurethane Acrylate UA-1 was kept warm at 60 to 70° C., 2.4 parts of a photopolymerization initiator (Irgacure 184, trade name, produced by Ciba-Geigy Corp.) was added thereto and dissolved, and the resultant was dispersed by adding 120 parts of deionized water under stirring to obtain O/W Emulsion Type Coating Composition HC-2 having a nonvolatile content of 40%.

(Preparation of O/W Emulsion Type Coating Composition HC-3)

68 Parts of Polyurethane Acrylate UA-1 was kept warm at 60 to 70° C., 10 parts of a highly crosslinked polymethyl methacrylate particle having an average particle diameter of 3.0 µm (MX-300H, produced by The Soken Chemical & Engineering Co., Ltd.) and 2 parts of a photopolymerization initiator (Irgacure 184, trade name, produced by Ciba-Geigy Corp.) were added thereto little by little, and the resultant was stirred until the particle and photopolymerization initiator were uniformly dispersed in the urethane acrylate, to obtain a polyurethane acrylate mixture. Thereafter, 80 parts of the polyurethane acrylate mixture was kept warm at 60 to 70° C. and dispersed by adding 120 parts of deionized water under stirring to obtain O/W Emulsion Type Coating Composition HC-3 having a nonvolatile content of 40%.

(Preparation of O/W Emulsion Type Coating Composition HC-4)

10 Parts of a silica particle having an average particle diameter of 1.5 µm (refractive index: 1.46, Seahostar KE-P150, produced by Nippon Shokubai Co., Ltd.) was added to 20 parts of deionized water and dispersed for 30 minutes at 10,000 rpm by a Polytron disperser to prepare an aqueous solution of silica particle dispersion.

68 Parts of Polyurethane Acrylate UA-1 was kept warm at 60 to 70° C., 2 parts of a photopolymerization initiator (Irgacure 184, trade name, produced by Ciba-Geigy Corp.) was added thereto little by little, and the resultant was stirred until the photopolymerization initiator was uniformly dispersed in the urethane acrylate, to obtain a polyurethane acrylate mixture. Thereafter, 70 parts of the polyurethane acrylate mixture was kept warm at 60 to 70° C. and dispersed by adding 100 parts of deionized water under stirring. After the completion of dispersion, 30 parts of the aqueous solution of silica fine particle dispersion was added to obtain O/W Emulsion Type Coating Composition HC-4 having a nonvolatile content of 40%.

(Preparation of O/W Emulsion Type Coating Composition HC-5A)

20 Parts of cyclohexanone and 1.5 parts of a photopolymerization initiator (Irgacure 184, trade name, produced by Ciba-Geigy Corp.) were mixed with 28.5 parts of Polyurethane Acrylate UA-1 and 20 parts of DPHA (a mixture of dipentaerythritol hexaacrylate and dipentaerythritol pentaacrylate, produced by Nippon Kayaku Co., Ltd.) until the system became uniform. Furthermore, 30 parts of a highly crosslinked polymethyl methacrylate particle having an average particle diameter of 3.0 µm (MX-300H, produced by The Soken Chemical & Engineering Co., Ltd.) was added little by little, and the resultant was stirred until the particle was uniformly dispersed, to obtain a polyurethane acrylate mixture. This mixture was dispersed by adding 100 parts of deionized water to obtain O/W Emulsion Type Coating Composition HC-5A having a nonvolatile content of 40%.

(Preparation of O/W Emulsion Type Coating Composition HC-5)

100 Parts of O/W Emulsion Type Coating Composition HC-1 and 100 parts of O/W Emulsion Type Coating Composition HC-5A were mixed and stirred to obtain O/W Emulsion Type Coating Composition HC-5. In about 24 hours after the preparation, HC-5 was used for coating.

(Preparation of O/W Emulsion Type Coating Composition HC-5B)

20 Parts of cyclohexanone and 1.95 parts of a photopolymerization initiator (Irgacure 184, trade name, produced by Ciba-Geigy Corp.) were mixed with 53.05 parts of Polyurethane Acrylate UA-1 and 10 parts of DPHA (a mixture of dipentaerythritol hexaacrylate and dipentaerythritol pentaacrylate, produced by Nippon Kayaku Co., Ltd.) until the system became uniform. Furthermore, 15 parts of a highly crosslinked polymethyl methacrylate particle having an average particle diameter of 3.0 µm (MX-300H, produced by The Soken Chemical & Engineering Co., Ltd.) was added little by little, and the resultant was stirred until the particle was uniformly dispersed, to obtain a polyurethane acrylate mixture. This mixture was dispersed by adding 110 parts of deionized water to obtain O/W Emulsion Type Coating Composition HC-5B having a nonvolatile content of 40%. The thus-obtained composition had the same constituent components as those of HC-5. In about 24 hours after the preparation, HC-5B was used for coating.

(Preparation of O/W Emulsion Type Coating Composition HC-6)

0.4 Parts of a photopolymerization initiator (UVI-2 shown above) was added to 120 parts of deionized water to prepare an aqueous solution of photopolymerization initiator. Thereafter, 2.0 parts of a photopolymerization initiator (Irgacure 184, trade name, produced by Ciba-Geigy Corp.) was added to 77.6 parts of Polyurethane Acrylate UA-1 and dissolved, and the resultant was kept warm at 60 to 70° C. and dispersed by adding 122.4 parts of the aqueous solution of photopolymerization initiator under stirring to obtain O/W Emulsion Type Coating Composition HC-6 having a nonvolatile content of 40%.

(Preparation of O/W Emulsion Type Coating Composition HC-7)

0.1 Part of a leveling agent (F-410, trade name, produced by Dainippon Ink and Chemicals, Inc.) was added to 20 parts of deionized water to prepare an aqueous solution of leveling agent. 77.5 Parts of polyurethane acrylate was kept warm at 60 to 70° C., and 2.4 parts of a photopolymerization initiator (Irgacure 184, trade name, produced by Ciba-Geigy Corp.) was added thereto. After stirring until the system became uniform, the resultant was dispersed by adding 100 parts of deionized water under stirring, and 20.1 parts of the aqueous solution of leveling agent was added to obtain O/W Emulsion Type Coating Composition HC-7 having a nonvolatile content of 40%.

(Preparation of O/W Emulsion Type Coating Composition HC-8)

76 Parts of Polyurethane Acrylate UA-1 was kept warm at 60 to 70° C., 0.5 parts of an emulsifier (KAYAMER PM-21 (produced by Nippon Kayaku Co., Ltd.)), 0.5 parts of an emulsifier (M-5300 (produced by Toagosei Co., Ltd.)), 1.0 part of an emulsifier (Adeka Reasoap NE-30 (produced by Asahi Denka Co., Ltd.)) and 2 parts of a photopolymerization initiator (Irgacure 184, trade name, produced by Ciba-Geigy Corp.) were added thereto little by little, and the resultant was stirred until the emulsifiers and photopolymerization initiator were uniformly dispersed in the urethane acrylate, to obtain a polyurethane acrylate mixture. Thereafter, 80 parts of the polyurethane acrylate mixture was kept warm at 60 to 70° C. and dispersed by adding 120 parts of deionized water under stirring to obtain O/W Emulsion Type Coating Composition HC-8 having a nonvolatile content of 40%.

(Preparation of Hardcoat Film (HCL-1 to HCL-8))

A 80 µm-thick triacetyl cellulose film (FUJI-TAC TDY80UL, produced by Fuji Photo Film Co., Ltd., Re=2 nm, Rth=48 nm) in a roll form was unrolled, Coating Solutions HC-1 to HC-8 and HC-5B for Hardcoat Layer each was coated thereon by the die coating method, dried at 30° C. for 15 seconds and at 80° C. for 60 seconds, and then irradiated with an ultraviolet ray at an irradiation dose of 300 mJ/cm² by using an air-cooled metal halide lamp of 240 W/cm (manufactured by Eye Graphics Co., Ltd.) in an atmosphere having an oxygen concentration of 0.01% to cure the coating layer, thereby forming a hardcoat layer having a dry thickness of 10 μm, and the film was then taken up. In this way, Hardcoat Films HCL-1 to HCL-8 were prepared. Also, Hardcoat Films HCL-9 and HCL-10 were prepared under the same conditions as those in the preparation of HCL-1 to HCL-8 except that in HC-1 and HC-4, the coating layer was cured by irradiating an ultraviolet ray at an irradiation dosage of 50 mJ/cm² using an air-cooled metal halide lamp of 160 W/cm (manufactured by Eye Graphics Co., Ltd.) under nitrogen purging.

(Evaluation of Hardcoat Film)

Hardcoat Films HCL-1 to HCL-8 prepared were subjected to the following evaluations.

(Evaluation of Point Defect)

The back surface of each hardcoat film was blackened with a marker ink or the like and the number of bright point defects on the coating film was evaluated with an eye. The size of the bright point defect observed with an eye was 50 μm or more. The bright point defect was counted in terms of the average number of point defects per m² when 20 m² was observed. The film was rated X when the number of bright point defects observed per m² was 2 or more, and rated ○ when less than 2.

(Evaluation of Pencil Hardness)

The hardness of the hardcoat film was evaluated by a pencil hardness test according to JIS K-5400. The film was rated X when the pencil hardness is 2H or less, rated ○ when 3H or more, and rated ⊚ when 4H or more.

(Evaluation of Curl)

The curl was measured using a curl measurement template of Method A in the "Measuring Method of Curl of Photographic Film" of JIS K-7619-1988.

The curl size of the film after humidity conditioning for 10 hours under the conditions of 25° C. and 60% RH is represented by the following mathematical formula (6):

$$Curl = 1/R \qquad \text{Mathematical Formula (6):}$$

wherein R is the curvature radius (m).

Here, the "+" curl indicates a curl where the coated side of the film comes to the inside of the curve, and the "−" curl indicates a curl where the coated side comes to the outside of the curve.

In the present invention, the film was rated ○ when the value represented by mathematical formula (6) is in the range from −7 to +7, and rated X when out of this range.

(Evaluation of Adhesion)

The adhesion between the transparent support and the hardcoat layer can be measured by the following method.

The surface on the side having the hardcoat layer was incised with a cutter knife at intervals of 1 mm to form 11 vertical lines and 11 horizontal lines in a crosshatch pattern and thereby define 100 squares in total. A test of press-bonding a polyester pressure-sensitive adhesive tape (No. 31B) produced by Nitto Denko Corp. and after standing for 24 hours, peeling off the tape was repeated three times on the same site, and the presence or absence of separation was observed with an eye.

The number of squares separated out of 100 squares is preferably 10 or less (○), more preferably 2 or less (⊚). The film where more than 10 squares were separated was rated X.

(Evaluation of Brittleness (Cracking Resistance))

The hardcoat film is cut into 35 mm×120 mm and after standing for 2 hours under the conditions of a temperature of 25° C. and a relative humidity of 60%, rolled into a cylindrical form, and the surface cracking can be evaluated by measuring the curvature diameter when the film starts cracking.

As regards the cracking resistance of the hardcoat film of the present invention, the curvature diameter when the film rolled with the coated layer side being outside starts cracking is preferably 50 mm or less (Δ), more preferably 40 mm or less (○), and most preferably 30 mm or less (⊚). The level of Δ or higher was acceptable.

(Evaluation of Surface State)

The hardcoat film surface on the side not stacked with the hardcoat layer was rubbed with sandpaper, and the area of 40 cm×40 cm on the rubbed surface was daubed with a black maker. The state on the antireflection film surface was observed with an eye under a tungsten lamp. The film was rated ○ when unevenness was not visible in the plane, and rated X when unevenness was observed in the plane.

(Evaluation of Antiglare Property)

A bare fluorescent lamp without louver (8,000 cd/m²) was reflected on the obtained hardcoat film from an angle of 45°, and the blurring degree of the reflected image observed from the direction of −45° was evaluated according to the following criteria.

⊚: The outline of the fluorescent lamp was not recognized at all.

○: The outline of the fluorescent lamp was slightly recognized.

Δ: The fluorescent lamp was blurred, but the outline thereof could be recognized.

X: The fluorescent lamp was scarcely blurred.

(Evaluation of Stability of Coating Composition)

The O/W emulsion type coating composition was allowed to stand still for one month under the condition of 25° C. and thereafter, the stability was evaluated by the outer appearance and particle size distribution (determined using LPA-3100, manufactured by Otsuka Electronics Co., Ltd.) of the coating composition.

⊚: The particle size and liquid state both were scarcely changed.

○: Slight water separation was observed, but the redispersibility was good and the particle size was scarcely changed.

Δ: The redispersibility was good, but the particle size was changed.

X: Separation between the oil phase and the aqueous phase was observed.

The evaluation results of Hardcoat Films HCL-1 and HCL-2 are shown in Table 1.

TABLE 1

|  | HCL-1 Invention | HCL-2 Comparison |
| --- | --- | --- |
| Point defect | ○ | ○ |
| Pencil hardness | ○ | ○ |
| Curl | ○ | ○ |
| Brittleness | ○ | ○ |
| Adhesion | ○ | X |

The hardcoat film of the present invention ensures good adhesion between the substrate and the hardcoat layer, satisfies other performances and is preferred as a hardcoat film. The evaluation results of Hardcoat Film HCL-3 are shown in Table 2.

TABLE 2

|  | HCL-3 Invention |
| --- | --- |
| Point defect | ○ |
| Pencil hardness | ⊚ |
| Curl | ○ |
| Brittleness | ○ |

It is seen that surprisingly, the hardcoat film of the present invention is specifically high in the film hardness. The cause thereof is not clearly known but is presumed such that a highly crosslinked particle is added to the layer and the particles dispersed in the oil phase are uniformly dispersed to enable efficiently enhancing the film hardness.

The evaluation results of Hardcoat Films HCL-4 and HCL-2 are shown in Table 3.

TABLE 3

|  | HCL-4 Invention | HCL-2 Comparison |
| --- | --- | --- |
| Point defect | ○ | ○ |
| Pencil hardness | ○ | ○ |
| Curl | ○ | ○ |
| Brittleness | ○ | ○ |
| Antiglare property | ⊚ | X |

It is seen that the hardcoat film of the present invention satisfies the performance required of the hardcoat film and is excellent in the antiglare property. This is presumed to result because fine particles are added in the aqueous phase to allow the formation of a fine particle-aggregated structure during drying and good antiglare property is thereby imparted.

The evaluation results of Hardcoat Films HCL-5 and HCL-5B are shown in Table 4.

TABLE 4

|  | HCL-5 Invention | HCL-5B Invention |
| --- | --- | --- |
| Point defect | ○ | ○ |
| Pencil hardness | ⊚ | ⊚ |
| Curl | ○ | ○ |
| Brittleness | ○ | ○ |
| Antiglare property | ⊚ | ⊚ |

It is seen that the hardcoat film containing a highly crosslinked particle and a polyfunctional acrylate of the present invention is excellent in the pencil hardness and antiglare property in both cases of being formed from Composition HC-5 which is a mixture of HC-5A and HC-1 and being formed from HC-5B having the same formulation as HC-5.

TABLE 5

|  | HC-1 Invention | HC-5A Invention | HC-5 Invention | HC-5B Invention |
| --- | --- | --- | --- | --- |
| Stability of coating composition | ○ | ○ | Δ | Δ |

It is seen that Coating Compositions HC-1 and HC-5A of the present invention have good long-term stability. The composition (HC-5) prepared by mixing those coating compositions and HC-5B having the same formulation as HC-5 are slightly poor in the long-term stability, but it is seen that even when the stability is slightly poor in the state of formulation after mixing the compositions, if these compositions are stored in the state of a composition excellent in stability and mixed before coating, the same performance can be exerted and excellent productivity is attained.

The evaluation results of Hardcoat Films HCL-6 and HCL-2 are shown in Table 6.

TABLE 6

|  | HCL-6 Invention | HCL-2 Comparison |
| --- | --- | --- |
| Point defect | ○ | ○ |
| Pencil hardness | ○ | ○ |
| Curl | ○ | ○ |
| Brittleness | ○ | ○ |
| Adhesion | ○ | X |

The hardcoat film containing the water-soluble photo-polymerization initiator of the present invention and a conventional hydrophobic photopolymerization initiator ensures good adhesion between the substrate and the hardcoat layer and at the same time, satisfies other performances, and this film is preferred as a hardcoat film.

The evaluation results of Hardcoat Films HCL-7 and HCL-2 are shown in Table 7.

TABLE 7

|  | HCL-7 Invention | HCL-2 Comparison |
| --- | --- | --- |
| Point defect | ○ | ○ |
| Pencil hardness | ○ | ○ |
| Curl | ○ | ○ |
| Brittleness | ○ | ○ |
| Surface state | ○ | X |

The hardcoat film of the present invention is assured of good surface state by virtue of addition of a leveling agent and enables to obtain a hardcoat film with good productivity, and this is preferred. The evaluation results of Hardcoat Film HCL-8 and HCL-2 are shown in Table 8.

TABLE 8

|  | HCL-8 Invention | HCL-2 Comparison |
| --- | --- | --- |
| Point defect | ○ | ○ |
| Pencil hardness | ○ | ○ |
| Curl | ○ | ○ |
| Brittleness | ○ | ○ |
| Stability of coating composition | ○ | X |

The hardcoat film of the present invention is assured of good stability of coating composition by virtue of addition of an emulsifier and enables to obtain a hardcoat film with good productivity, and this is preferred.

(Preparation of Coating Solution for Low Refractive Index Layer)

(Preparation of Sol Solution (b-1))

In a reaction vessel equipped with a stirrer and a reflux condenser, 119 parts by mass of methyl ethyl ketone, 101 parts by mass of 3-acryloyloxypropyltrimethoxysilane "KBM-5103" {produced by Shin-Etsu Chemical Co., Ltd.} and 3 parts by mass of diisopropoxyaluminum ethyl acetate were added and mixed and after adding 30 parts by mass of ion-exchanged water, the reaction was allowed to proceed at 60° C. for 4 hours. The reaction solution was cooled to room temperature to obtain Sol Solution (b-1).

The mass average molecular weight of Sol Solution (b-1) was 1,600 and out of the oligomer or higher components, the proportion of the components having a molecular weight of 1,000 to 20,000 was 100 mass %. Also, the gas chromatography analysis revealed that the raw material acryloyloxypropyltrimethoxysilane was not remaining at all.

(Preparation of Coating Solution for Low Refractive Index Layer)

13 Parts of a thermal crosslinking fluorine-containing polymer (JTA113, solid content concentration: 6%, produced by JSR Corp.) having a refractive index of 1.44 and containing polysiloxane and a hydroxyl group, 1.3 parts of colloidal silica liquid dispersion MEK-ST-L (trade name, produced by Nissan Chemicals Industries, Ltd., average particle diameter: 45 nm, solid content concentration: 30%), 0.6 parts of Sol Solution (b-1), 5 parts of methyl ethyl ketone and 0.6 parts of cyclohexanone were added and after stirring, the resultant was filtered through a polypropylene-made filter having a pore size of 1 μm to prepare Coating Solution A for Low Refractive Index Layer. The refractive index of the layer formed of this coating solution was 1.45. This coating solution for low refractive index layer was coated on each of Hardcoat Films HCL-9 and HCL-10 under the following conditions to produce Antireflection Films LR-1 and LR-2.

(Coating of Low Refractive Index Layer)

Hardcoat Films HCL-9 and HCL-10 each was again unrolled, the coating solution for low refractive index layer was coated thereon under the following basic conditions by using a die coater shown in FIG. 2(A) and FIGS. 3, 4 and 5 of JP-A-2003-211052 and after drying at 120° C. for 150 seconds and further at 100° C. for 8 minutes, irradiated with an ultraviolet ray at an irradiation dose of 300 mJ/cm$^2$ by using an air-cooled metal halide lamp of 240 W/cm (manufactured by Eye Graphics Co., Ltd.) in an atmosphere having an oxygen concentration reduced to 0.1% under nitrogen purging, thereby forming a low refractive index layer having a thickness of 95 nm, and the film was then taken up. In this way, Antireflection films LR-1 and LR-2 were produced.

Basic Conditions:

A slot die 13 where the upstream lip land length $I_{UP}$ is 0.5 mm, the downstream lip land length $I_{LO}$ is 50 μm, the length of the opening of the slot 16 in the web running direction is 150 μm and the length of the slot 16 is 50 mm, was used. The gap between the upstream lip land 18*a* and the web W was set 50 μm longer than the gap between the downstream lip land 18*b* and the web W, and the gap GL between the downstream lip land 18*b* and the web W was set to 50 μm. The gap $G_s$ between the side plate 40*b* of the low-pressure chamber 40 and the web W and the gap GB between the back plate 40*a* and the web W both were set to 200 μm. The coating was performed at a coating speed of 30 m/min to give a coated amount of 5.0 ml/m$^2$. The coating width was set to 1,300 mm and the effective width was set to 1,280 mm.

(Evaluation of Antireflection Film)

With respect to Antireflection Films LR-1 and LR-2 produced, the same evaluations as those performed in the evaluation of hardcoat film and the following evaluations were performed.

(Evaluation of Steel Wool Scratch Resistance)

A rubbing test was performed using "Rubbing Tester" under the following conditions.

Environmental conditions of evaluation: 25° C. and 60% RH

Rubbing Material:

A steel wool {Grade No. 0000, manufactured by Nippon Steel Wool K.K.} was wound around the rubbing tip (1 cm×1 cm) of the tester, which comes into contact with the sample, and fixed by a band not to move.

Moving distance (one way): 13 cm

Rubbing speed: 13 cm/sec

Load: 500 g/cm$^2$

Contact area of tip: 1 cm×1 cm

Number of rubbings: 10 reciprocations

An oily black ink was applied to the back side of the rubbed sample, scratches in the rubbed portion were observed by reflected light with an eye, and the number of scratches in the subbed portion was evaluated according to the following criteria.

⊚: Scratches were not recognized at all.

○: Three or less thin scratches were recognized.

Δ: Ten or less scratches were recognized.

X: More than ten scratches were recognized.

The level of ○ or higher was acceptable.

(Evaluation of Integrated Reflectance)

The integrated reflectance at an incident angle of 5° was measured in the wavelength region of 380 to 780 nm by using Spectrophotometer V-550 (manufactured by JASCO Corp.) having mounted therein Adapter ILV-471, and the average reflectance in the region of 450 to 650 nm was calculated. When the integrated reflectance is 3% or less, remarkable antireflection effect is obtained and this is preferred. The evaluation results are shown in Table 9.

TABLE 9

|  | LR-1 Invention | LR-2 Invention |
| --- | --- | --- |
| Point defect | ○ | ○ |
| Pencil hardness | ○ | ○ |
| Curl | ○ | ○ |
| Brittleness | ○ | ○ |
| Steel wool | ⊚ | ⊚ |
| Integrated reflectance | 2.8% | 2.7% |

It is seen from the results above that the anti-reflection film of the present invention is good in all of point defect, pencil hardness, curl and brittleness and is advantageous and further that when a low refractive index layer is stacked, an antireflection film assured of steel wool scratch resistance and reduced in the reflectance is obtained.

(Preparation of O/W Emulsion Type Coating Composition HC-11)

70.0 Parts of Polyurethane Acrylate UA-1 was kept warm at 60 to 70° C., 2.4 parts of a photopolymerization initiator (Irgacure 184, trade name, produced by Ciba-Geigy Corp.) was added thereto and dissolved, and the resultant was dispersed by adding 7.6 parts of 2-hydroxyethyl (meth)acrylate and 120 parts of deionized water under stirring to obtain O/W Emulsion Type Coating Composition HC-11 having a non-volatile content of 40%.

(Preparation of Hardcoat Film (HCL-11))

Hardcoat Film HCL-11 was prepared under the same condition as in the preparation of the Hardcoat Film HCL-1 except that the Coating Composition HC-11 was used.

The evaluation results of Hardcoat Films HCL-11 and HCL-2 are shown in Table 10.

TABLE 10

|  | HCL-11 Invention | HCL-2 Comparison |
|---|---|---|
| Point defect | ○ | ○ |
| Pencil hardness | ○ | ○ |
| Curl | ○ | ○ |
| Brittleness | ○ | ○ |
| Adhesion | ○ | X |

The hardcoat film of the present invention ensures good adhesion between the substrate and the hardcoat layer, satisfies other performances and is preferred as a hardcoat film.

(Preparation of Coating Solution for Overcoat Layer)

5.0 parts of DPHA (a mixture of dipentaerythritol hexaacrylate and dipentaerythritol pentaacrylate, produced by Nippon Kayaku Co., Ltd.), 55 parts of PET-30 (a mixture of pentaerythritol triacrylate and pentaerythritol tetraacrylate, produced by Nippon Kayaku Co., Ltd.), 2.0 parts of reactive Silicone, X-22-164C (trade name) (produced by Shin-Etsu Chemical Co., Ltd.), 2.0 parts of a photopolymerization initiator (Irgacure 127, trade name, produced by Ciba Specialty Chemicals Corp.) and 36 parts of methyl ethyl ketone were mixed to prepare the coating solution for overcoat layer.

(Preparation of Hardcoat Film HCL-10OC)

The prepared coating solution for overcoat layer was coated on the hardcoat film HCL-10 so that the layer made from the coating solution has a thickness of 0.8 μm after it is dried and cured. The coating solution for overcoat layer was coated with same coating applicator as that used for making the antireflection film LR-1, and after drying at 80° C. for 1 minute, it is irradiated with an ultraviolet ray at an irradiation dose of 300 mJ/cm² by using an air-cooled metal halide lamp of 240 W/cm (manufactured by Eye Graphics Co., Ltd.) in an atmosphere having an oxygen concentration reduced to 0.01% under nitrogen purging, thereby forming an overcoat layer having a thickness of 0.8 μm, and the film was then taken up. In this way, Hardcoat film HCL-10OC was produced.

(Evaluation of Hardcoat Film)

The evaluation results of Hardcoat Films HCL-10 and HCL-10OC are shown in Table 11.

TABLE 11

|  | HCL-10 Invention | HCL-10OC Invention |
|---|---|---|
| Point defect | ○ | ○ |
| Pencil hardness | ○ | ○ |
| Curl | ○ | ○ |
| Brittleness | ○ | ○ |
| Steel wool | ○ | ◎ |

It is seen from the results above that by providing an overcoat layer on the hardcoat film of the present invention, scratch resistance of the surface of the coated layer such as steel wool scratch resistance can be improved.

This application is based on Japanese Patent application JP 2006-127515, filed May 1, 2006, the entire content of which is hereby incorporated by reference, the same as if set forth at length.

What is claimed is:

1. A laminate comprising a transparent support and a cured layer formed by curing an oil-in-water emulsion coating composition having an aqueous phase and an oil phase, the oil-in-water emulsion coating composition comprising:
an active energy ray-curable polyfunctional (meth)acrylate having three or more (meth)acryloyl groups within a molecule; and
an organic solvent,
in the oil phase, the organic solvent having a solubility of 20 g or less in 100 g of water and having a property capable of swelling or dissolving a substrate, wherein the coating composition further comprises at least one of a fluorine-based leveling agent and a silicone-based leveling agent in at least one of the aqueous phase and the oil phase.

2. A laminate comprising a transparent support and a cured layer formed by curing an oil-in-water emulsion coating composition having an aqueous phase and an oil phase, the oil-in-water emulsion coating composition comprising:
an active energy ray-curable polyfunctional (meth)acrylate having three or more (meth)acryloyl groups within a molecule, and an organic solvent, in the oil phase, the organic solvent having a solubility of 20 g or less in 100 g of water and having a property capable of swelling or dissolving a substrate; and
an active energy ray-curable polyfunctional (meth)acrylate having one or more (meth)acryloyl group within a molecule and having a solubility of 3 g or more in 100 g of water, in the aqueous phase, wherein the coating composition further comprises at least one of a fluorine-based leveling agent and a silicone-based leveling agent in at least one of the aqueous phase and the oil phase.

3. A laminate comprising a transparent support and a cured layer formed by curing an oil-in-water emulsion coating composition having an aqueous phase and an oil phase, the oil-in-water emulsion composition comprising:
a first emulsion containing an active energy ray-curable polyfunctional (meth)acrylate having three or more (meth)acryloyl groups within a molecule; and an organic solvent, in the oil phase, the organic solvent having a solubility of 20 g or less in 100 g of water and having a property capable of swelling or dissolving a substrate; and
a second emulsion containing at least one compound not contained in the first emulsion, wherein the coating composition further comprises at least one of a fluorine-based leveling agent and a silicone-based leveling agent in at least one of the aqueous phase and the oil phase.

4. The laminate of claim 1, further comprising a particle having an average particle diameter of from 1 to 10 μm in at least one of the aqueous phase and the oil phase.

5. The laminate of claim 2, further comprising a particle having an average particle diameter of from 1 to 10 μm in at least one of the aqueous phase and the oil phase.

6. The laminate of claim 3, further comprising a particle having an average particle diameter of from 1 to 10 μm in at least one of the aqueous phase and the oil phase.

7. The laminate of claim 1, wherein the organic solvent has a boiling point of from 75 to 220° C.

8. The laminate of claim 1, wherein a proportion of the organic solvent in the coating composition is from 1 to 30 wt %.

9. The laminate of claim 1, further comprising a photopolymerization initiator in at least one of the aqueous phase and the oil phase.

10. The laminate of claim 2, further comprising a photopolymerization initiator in at least one of the aqueous phase and the oil phase.

11. The laminate of claim 3, further comprising a photopolymerization initiator in at least one of the aqueous phase and the oil phase.

12. An optical film or an antireflection film comprising the laminate of claim 1.

13. A polarizing plate comprising two protective films and a polarizing film provided between the protective films, wherein at least one of the protective films is a laminate comprising a transparent support and a cured layer formed by curing an oil-in-water emulsion coating composition having an aqueous phase and an oil phase, the oil-in-water emulsion coating, composition comprising:
    an active energy ray-curable polyfunctional (meth)acrylate having three or more (meth)acryloyl groups within a molecule; and
    an organic solvent,
in the oil phase, the organic solvent having a solubility of 20 g or less in 100 g of water and having a property capable of swelling or dissolving a substrate.

14. An image display device comprising a laminate comprising a transparent support and a cured layer formed by curing an oil-in-water emulsion coating composition having an aqueous phase and an oil phase, the oil-in-water emulsion coating composition comprising:
    an active energy ray-curable polyfunctional (meth)acrylate having three or more (meth)acryloyl groups within a molecule; and
    an organic solvent,
in the oil phase, the organic solvent having a solubility of 20 g or less in 100 g of water and having a property capable of swelling or dissolving a substrate.

15. A method for producing the laminate of claim 1 comprising: coating the coating composition on the transparent support; and drying the coated composition.

16. The laminate of claim 1, wherein the organic solvent has a boiling point of from 90 to 200° C.

17. The laminate of claim 2, wherein the organic solvent has a boiling point of from 90 to 200° C.

18. The laminate of claim 3, wherein the organic solvent has a boiling point of from 90 to 200° C.

19. The laminate of claim 1, wherein the organic solvent has a boiling point of from 100 to 180° C.

20. The laminate of claim 2, wherein the organic solvent has a boiling point of from 100 to 180° C.

21. The laminate of claim 3, wherein the organic solvent has a boiling point of from 100 to 180° C.

22. The laminate of claim 1, wherein the organic solvent is least one selected from the group consisting of cyclohexanone, n-butanol, ethyl acetate, butyl acetate, methyl isobutyl ketone, toluene, xylene and cyclohexane.

23. The laminate of claim 2, wherein the organic solvent is least one selected from the group consisting of cyclohexanone, n-butanol, ethyl acetate, butyl acetate, methyl isobutyl ketone, toluene, xylene and cyclohexane.

24. The laminate of claim 3, wherein the organic solvent is least one selected from the group consisting of cyclohexanone, n-butanol, ethyl acetate, butyl acetate, methyl isobutyl ketone, toluene, xylene and cyclohexane.

25. A polarizing plate comprising two protective films and a polarizing film provided between the protective films, wherein at least one of the protective films is a laminate of claim 1.

26. An image display device comprising the laminate of claim 1.

27. A polarizing plate comprising two protective films and a polarizing film provided between the protective films, wherein at least one of the protective films is a laminate comprising a transparent support and a cured layer formed by curing an oil-in-water emulsion coating composition having an aqueous phase and an oil phase, the oil-in-water emulsion coating composition comprising:
    an active energy ray-curable polyfunctional (meth)acrylate having three or more (meth)acryloyl groups within a molecule, and an organic solvent, in the oil phase, the organic solvent having a solubility of 20 g or less in 100 g of water and having a property capable of swelling or dissolving a substrate; and
    an active energy ray-curable polyfunctional (meth)acrylate having one or more (meth)acryloyl group within a molecule and having a solubility of 3 g or more in 100 g of water, in the aqueous phase.

28. An image display device comprising a laminate comprising a transparent support and a cured layer formed by curing an oil-in-water emulsion coating composition having an aqueous phase and an oil phase, the oil-in-water emulsion coating composition comprising:
    an active energy ray-curable polyfunctional (meth)acrylate having three or more (meth)acryloyl groups within a molecule, and an organic solvent, in the oil phase, the organic solvent having a solubility of 20 g or less in 100 g of water and having a property capable of swelling or dissolving a substrate; and
    an active energy ray-curable polyfunctional (meth)acrylate having one or more (meth)acryloyl group within a molecule and having a solubility of 3 g or more in 100 g of water, in the aqueous phase.

29. A polarizing plate comprising two protective films and a polarizing film provided between the protective films, wherein at least one of the protective films is a laminate comprising a transparent support and a cured layer formed by curing an oil-in-water emulsion coating composition having an aqueous phase and an oil phase, the oil-in-water emulsion coating composition comprising:
    a first emulsion containing an active energy ray-curable polyfunctional (meth)acrylate having three or more (meth)acryloyl groups within a molecule; and an organic solvent, in the oil phase, the organic solvent having a solubility of 20 g or less in 100 g of water and having a property capable of swelling or dissolving a substrate; and
    a second emulsion containing at least one compound not contained in the first emulsion.

30. An image display device comprising a laminate comprising a transparent support and a cured layer formed by curing an oil-in-water emulsion coating composition having an aqueous phase and an oil phase, the oil-in-water emulsion coating composition comprising:
    a first emulsion containing an active energy ray-curable polyfunctional (meth)acrylate having three or more (meth)acryloyl groups within a molecule; and an organic solvent, in the oil phase, the organic solvent having a solubility of 20 g or less in 100 g of water and having a property capable of swelling or dissolving a substrate; and
    a second emulsion containing at least one compound not contained in the first emulsion.

* * * * *